(12) United States Patent
Ebisuno

(10) Patent No.: US 10,074,310 B2
(45) Date of Patent: Sep. 11, 2018

(54) DISPLAY DEVICE AND DISPLAY DEVICE CONTROL METHOD

(71) Applicant: JOLED INC., Tokyo (JP)

(72) Inventor: Kohei Ebisuno, Tokyo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/516,506

(22) PCT Filed: Oct. 2, 2015

(86) PCT No.: PCT/JP2015/005025
§ 371 (c)(1),
(2) Date: Apr. 3, 2017

(87) PCT Pub. No.: WO2016/056211
PCT Pub. Date: Apr. 14, 2016

(65) Prior Publication Data
US 2018/0108295 A1  Apr. 19, 2018

(30) Foreign Application Priority Data

Oct. 6, 2014  (JP) .................................. 2014-205976

(51) Int. Cl.
*G06F 1/00* (2006.01)
*G09G 3/3233* (2016.01)
(Continued)

(52) U.S. Cl.
CPC ....... *G09G 3/3233* (2013.01); *H01L 27/1255* (2013.01); *H01L 51/5012* (2013.01); *G09G 2300/0819* (2013.01)

(58) Field of Classification Search
CPC .......... G09G 3/20; G09G 5/00; G09G 3/3233; G09G 2300/0819; G09G 2300/0861;
(Continued)

(56) References Cited

U.S. PATENT DOCUMENTS

2008/0291125 A1* 11/2008 Yamashita ........... G09G 3/3233
345/55
2010/0289788 A1* 11/2010 Yoshizaki ............ G09G 3/3233
345/211
(Continued)

FOREIGN PATENT DOCUMENTS

| JP | 2008-287139 | 11/2008 |
|----|-------------|---------|
| JP | 2009-157157 | 7/2009 |
| JP | 2010-266715 | 11/2010 |

OTHER PUBLICATIONS

International Search Report, dated Dec. 28, 2015 by the Japan Patent Office (JPO), in the corresponding International Application No. PCT/JP2015/005025.

*Primary Examiner* — Michael Faragalla
(74) *Attorney, Agent, or Firm* — Greenblum & Bernstein, P.L.C.

(57) ABSTRACT

A display device includes a display pixel having: an organic EL element; a capacitor element; a drive transistor having a gate electrode connected to a first electrode of the capacitor element and a source electrode connected to a second electrode of the capacitor element and to an anode electrode of the organic EL element; a first switch element switching a state between a signal line supplying a voltage corresponding to a data signal and the first electrode of the capacitor element, between conducting and non-conducting states; and a resistance unit having a resistance, switching a state between a power line supplying an initialization voltage and the second electrode of the capacitor element between the conducting and non-conducting states, and disposed on a current path from a node that is a connection point of the second electrode and the anode electrode of the organic EL element to the power line.

7 Claims, 25 Drawing Sheets

(51) Int. Cl.
*H01L 51/50* (2006.01)
*H01L 27/12* (2006.01)

(58) Field of Classification Search
CPC ........ G09G 2300/0842; H01L 27/3276; H01L 27/3265; G06F 1/00
See application file for complete search history.

(56) References Cited

U.S. PATENT DOCUMENTS

2013/0002635 A1  1/2013  Yamashita et al.
2014/0264355 A1  9/2014  Yamashita et al.

* cited by examiner

DISPLAY DEVICE AND DISPLAY DEVICE CONTROL METHOD

TECHNICAL FIELD

The present invention relates to a display device that includes an organic electroluminescent (EL) element and to a display device control method.

BACKGROUND ART

One known example of a display device that includes a current-driven light-emitting element is an organic EL display that includes an organic electroluminescent element (hereinafter, referred to as the organic EL element) (see Patent Literature [PTL] 1). Such an organic EL display has the advantages of excellent viewing angle characteristics and low power consumption.

The organic EL display is configured with: an organic EL panel (a display panel) formed from a glass substrate on which organic EL elements, wiring lines, and so forth are formed; an integrated circuit (IC) that drives the organic EL panel; and a control unit.

The organic EL panel includes a plurality of display pixels arranged in a matrix. Each of the display pixels includes: an organic EL element described above; a capacitor element that stores a voltage corresponding to a pixel signal; and a drive transistor that supplies the organic EL element with a drive current corresponding to an amount of electrical charge stored in the capacitor element.

An active-matrix organic EL display includes a thin film transistor (TFT) as a drive transistor. The TFT has in-plane variations in film thickness and film quality because of, for example: a temperature variation caused in a film formation process, a variation in residual solution caused by an etching process; and a variation in pattern density. This thereby causes a variation in threshold voltage in the plane of the display panel. In addition, the threshold voltage changes over time due to a stress, such as a gate-source voltage upon the application of current. The initial variations resulting from the processes and the time-varying change in the threshold voltage cause a variation in the amount of current to be supplied to the organic EL. Thus, such variations and change influence luminance control of the display device and thereby degrade the display quality.

For a conventional organic EL display, threshold voltage compensation is performed after initialization to adjust the voltage of a source electrode of a drive transistor according to a threshold voltage.

CITATION LIST

Patent Literature

[PTL 1] Japanese Unexamined Patent Application Publication No. 2008-287139

SUMMARY OF INVENTION

Technical Problem

However, the threshold voltage is different depending on, for example, a characteristic variation among the drive transistors and a cumulative value of a luminance value. For this reason, the threshold voltage varies in the organic EL panel. When the threshold voltage varies, a period in which threshold voltage compensation is performed (hereinafter, referred to as the "threshold voltage compensation period") needs to be increased to perform the threshold voltage compensation on the plurality of organic EL elements more reliably.

In view of this, the present invention provides a display device that accurately performs the threshold voltage compensation without increasing the length of the threshold voltage compensation period.

Solution to Problem

A display device according to an aspect of the present invention includes a display pixel and a control unit which controls driving of the display pixel, wherein the display pixel includes: a light-emitting element; a capacitor element that holds a voltage; a drive transistor that has (i) a gate electrode connected to a first electrode of the capacitor element and (ii) a source electrode connected to a second electrode of the capacitor element and to an anode electrode of the light-emitting element; a first switch element that switches a state between a signal line for supplying a voltage corresponding to a data signal and the first electrode of the capacitor element, between conducting and non-conducting states; and a resistance unit that has a resistance, is able to switch a state between a power line for supplying an initialization voltage and the second electrode of the capacitor element between the conducting and non-conducting states, and is disposed on a current path from a connection point of the second electrode of the capacitor element and the anode electrode of the light-emitting element to the power line, and the control unit corrects a threshold voltage of the drive transistor.

It should be noted that these general or specific aspects may he achieved by a display device control method.

Advantageous Effects of Invention

With the display device and so forth according to the present invention, the threshold voltage compensation can be performed accurately without an increase in the threshold voltage compensation period.

DESCRIPTION OF EMBODIMENT (Details of Problem)

Figure 1:
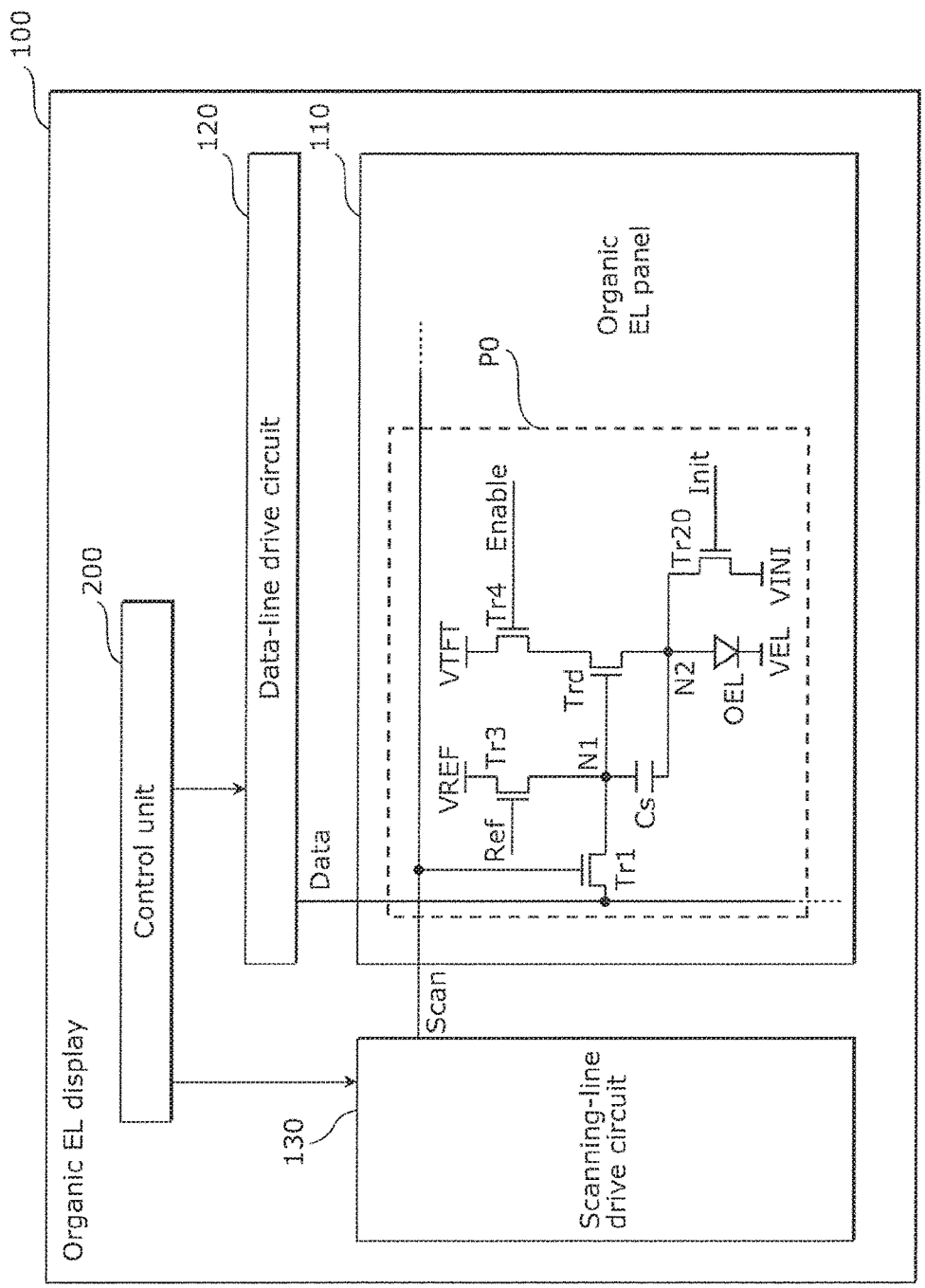
FIG. 1 is a block diagram showing an example of a configuration of an organic EL display according to a comparative example.
Figure 2:
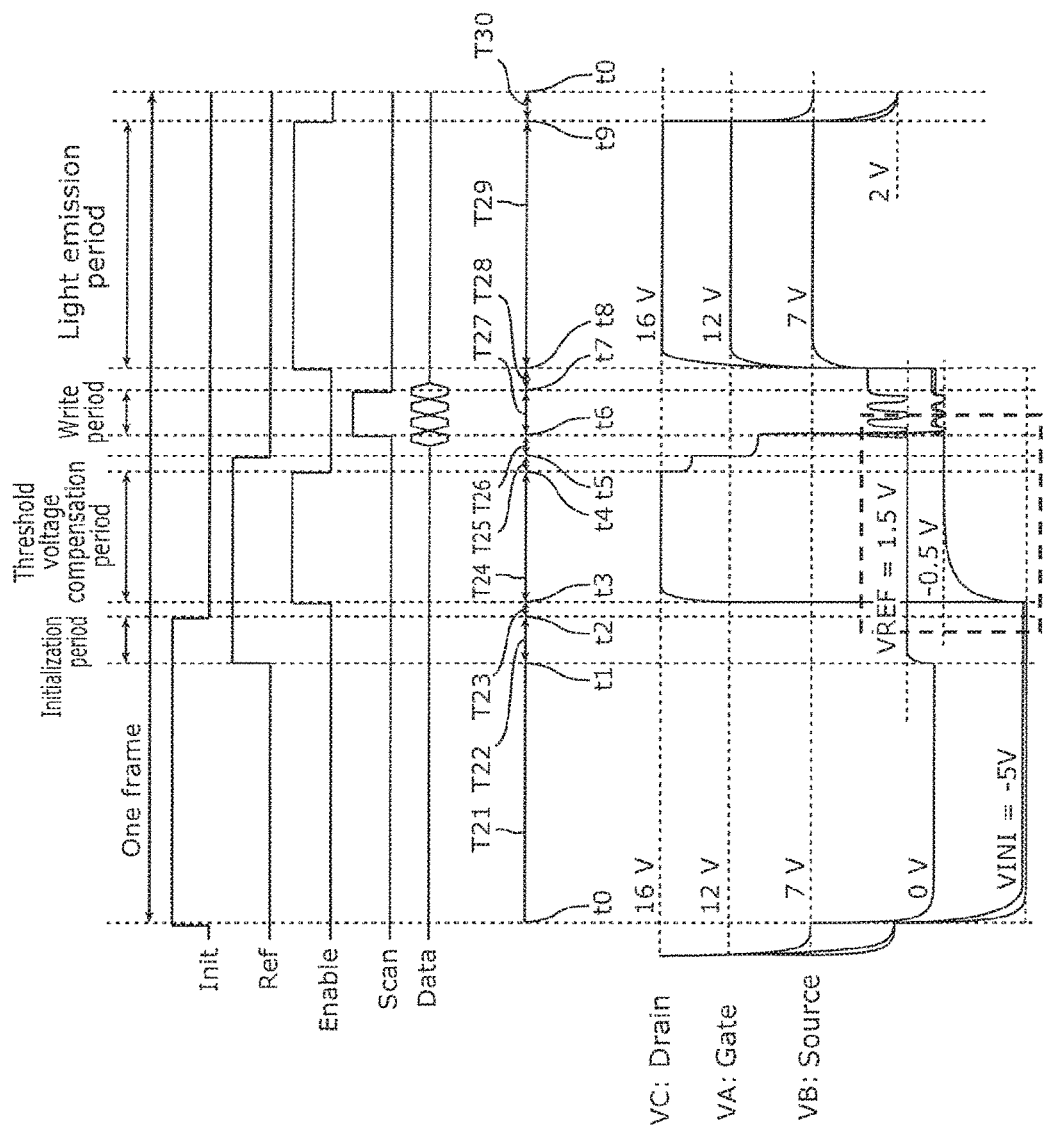
FIG. 2 is a graph showing signal waveforms of the organic EL display according to the comparative example.
Figure 3:
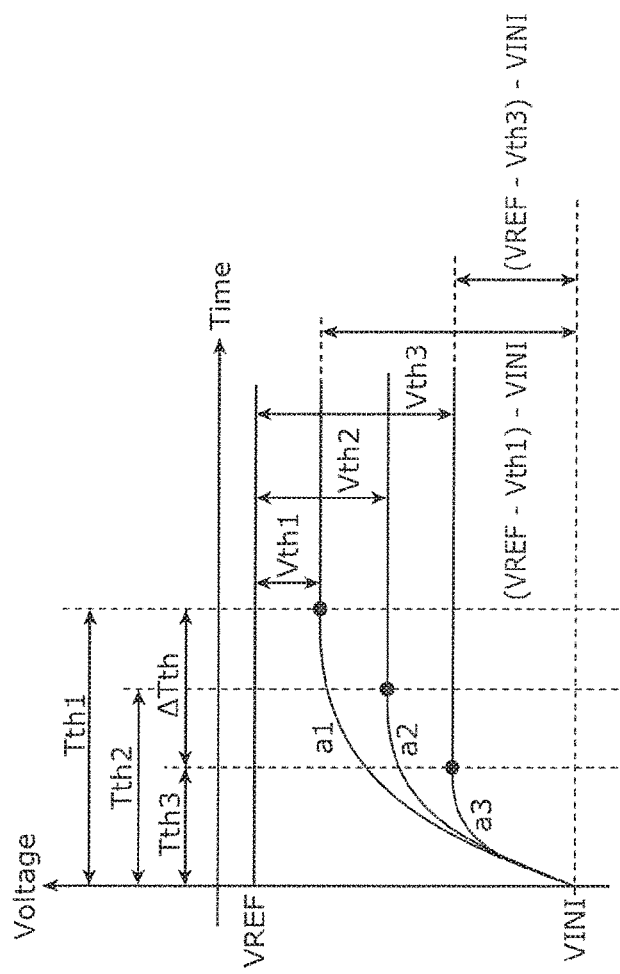
FIG. 3 is a diagram showing variations in voltage of source electrodes of drive transistors during the threshold voltage compensation period according to the comparative example.

The following describes the details of the problem, with reference to FIG. 1 to FIG. 3.

[Configuration of Organic EL Display in Comparative Example]

FIG. 1 is a block diagram showing an example of a configuration of an organic EL display 100 according to a comparative example. As shown in FIG. 1, the organic EL display 100 includes an organic EL panel 110, a data-line drive circuit 120, a scanning-line drive circuit 130, and a control unit 200.

The organic EL panel 110 includes a plurality of display pixels P0 arranged in a matrix. It should be noted that a display pixel P0 is a subpixel that corresponds to one color. One pixel is formed from three subpixels corresponding to red, green, and blue, respectively.

The display pixel P0 includes an organic EL element OEL, a capacitor element Cs, a drive transistor Trd, a first switch element Tr1, a second switch element Tr20, a third switch element Tr3, and a fourth switch element Tr4.

The organic EL element OEL is a light-emitting element that emits light corresponding to a drive current. The drive current is supplied from the drive transistor Trd. The organic EL element OEL includes: an anode electrode connected to a source electrode of the drive transistor Trd; and a cathode electrode connected to a power line VEL (VEL is, for example, a ground voltage).

The capacitor element Cs stores an electrical charge corresponding to a voltage of a data line Data. The capacitor element Cs includes: a first electrode connected to a gate electrode of the drive transistor; and a second electrode connected to the source electrode of the drive transistor Trd.

The drive transistor Trd supplies the organic EL element OEL with a drive current corresponding to the charge quantity that is stored in the capacitor element Cs according to the voltage of the data line Data. The drive transistor Trd is a thin film transistor and includes: the gate electrode connected to the first electrode of the capacitor element Cs; the source electrode connected to the anode electrode of the organic EL element OEL; and a drain electrode connected to a power line VTFT.

The first switch element Tr1 switches a state of the display pixel P0 between a selected state and an unselected state, by switching a state between the data line Data and the first electrode of the capacitor element Cs between a conducting state and a non-conducting state according to a voltage of a scanning line Scan. To be more specific, the first switch element Tr1 is a thin film transistor and includes: a gate electrode connected to the scanning line Scan; a source electrode connected to the data line Data; and a drain electrode connected to the first electrode of the capacitor element Cs.

The second switch element Tr20 switches a state between the second electrode (a node N2) of the capacitor element Cs and a power line VINI between the conducting state and the non-conducting state, according to a voltage of a signal line Init.

The third switch element Tr3 switches a state between the first electrode (a node N1) of the capacitor element Cs and a power line VREF between the conducting state and the non-conducting state, according to a voltage of a signal line Ref.

The fourth switch element Tr4 switches a state between the drain electrode of the drive transistor Trd and the power line VTFT between the conducting state and the non-conducting state, according to a voltage of a signal line Enable.

The data-line drive circuit 120 supplies a plurality of data lines Data with a voltage corresponding to a data signal received from the control unit 200.

The scanning-line drive circuit 130 supplies a plurality of scanning lines Scan, a plurality of signal lines Ink a plurality of signal lines Ref, and a plurality of signal lines Enable with a voltage corresponding to a drive signal received from the control unit 200.

The control unit 200 is a circuit that controls video display on the organic EL panel 110. The control unit 200 is configured with, for example, a timing controller (TCON). It should be noted that the control unit 200 may be configured with a computer system that includes a microcontroller or with a system large scale integration (system LSI), for example.

[Operation of Organic EL Display in Comparative Example]

FIG. 2 is a graph showing signal waveforms of the organic EL display 100 according to the comparative example. In FIG. 2, VA, VB, and VC represent a voltage of the gate electrode of the drive transistor Trd, a voltage of the source electrode of the drive transistor Trd, and a voltage of the drain electrode of the drive transistor Trd, respectively.

In the organic EL display 100 according to the comparative example, initialization, threshold voltage compensation, writing, and light emission are performed in this order as shown in FIG. 2 for each frame of a video signal that is externally received. The following describes: an initialization period in which initialization is performed; a threshold voltage compensation period in which threshold voltage compensation is performed; a write period in which writing is performed; and a light emission period in which the organic EL element DEL is caused to emit light. Thus, descriptions of periods other than these periods are omitted.

(Period T22: Initialization Period)

A period T22 from a time t1 to a time t2 shown in FIG. 2 is the initialization period. In the initialization period, the control unit 200 initializes the capacitor element Cs by bringing the first switch element Tr1 and the fourth switch element Tr4 into the non-conducting state and bringing the second switch element Tr20 and the third switch element Tr3 into the conducting state. To be more specific, the control unit 200 brings the first switch element Tr1 and the fourth switch element Tr4 into the non-conducting state by setting the voltages of the scanning line Scan and the signal line Enable at an L level. Moreover, the control unit 200 brings the second switch element Tr20 and the third switch element Tr3 into the conducting state by setting the voltages of the signal line Init and the signal line Ref at an H level.

(Period T24: Threshold Voltage Compensation Period)

A period T24 from a time t3 to a time t4 shown in FIG. 2 is the threshold voltage compensation period for compensating for an influence of variation in the threshold voltage of the drive transistor Trd. In the threshold voltage compensation period, the control unit 200 brings the first switch element Tr1 and the second switch element Tr20 into the non-conducting state and brings the third switch element Tr3 and the fourth switch element Tr4 into the conducting state. With the threshold voltage compensation period, the influence of the aforementioned variation in the threshold voltage upon the luminance control can be reduced. To be more specific, the control unit 200 brings the first switch element Tr1 and the second switch element Tr20 into the conducting state by setting the voltages of the scanning line Scan and the signal line Init at the L level. Moreover, the control unit 200 brings the third switch element Tr3 and the fourth switch element Tr4 into the conducting state by setting the voltages of the signal line Ref and the signal line Enable at the H level.

At this time, since the fourth switch element Tr4 is brought into the conducting state, a drain current passes through the drive transistor Trd and then a voltage value of the second electrode of the capacitor element Cs increases according to the threshold voltage of the drive transistor Trd. With this, compensation can be made for the threshold voltage.

(Period T27: Write Period)

A period T27 from a time t6 to a time t7 shown in FIG. 2 is a write time in which an electrical charge corresponding to the voltage of the data line Data is stored into the capacitor element Cs. In the write time, the control unit 200 brings the first switch element Tr1 into the conducting state and brings the second switch element Tr20, the third switch element Tr3, and the fourth switch element Tr4 into the non-conducting state. To be more specific, the control unit 200 brings the first switch element Tr1 into the conducting state by setting the voltage of the scanning line Scan at the H level. Moreover, the control unit 200 brings the second switch element Tr20, the third switch element Tr3, and the fourth switch element Tr4 into the non-conducting state by setting the voltages of the signal line Init, the signal line Reference, and the signal line Enable at the L level. Furthermore, the control unit 200 causes the data-line drive circuit 120 to apply a voltage corresponding to the luminance value of the selected display pixel P0 to the signal line Data.

At this time, the electrical charge corresponding to the voltage of the signal line Data is stored into the first electrode of the capacitor element Cs.

(Period T29: Light Emission Period)

A period T29 from a time t8 to a time t9 shown in FIG. 2 is the light emission period in which the organic EL element OEL is caused to emit light. In the light emission time, the control unit 200 brings the fourth switch element Tr4 into the conducting state and brings the first switch element Tr1, the second switch element Tr20, and the third switch element Tr3 into the non-conducting state. To be more specific, the control unit 200 brings the fourth switch element Tr4 into the conducting state by setting the voltage of the signal line Enable at the H level. Moreover, the control unit 200 brings the first switch element Tr1, the second switch element Tr20, and the third switch element Tr3 into the non-conducting state by setting the voltages of the scanning line Scan, the signal line Init, and the signal line Ref at the L level.

At this time, a drive current corresponding to the electrical charge stored in the first electrode of the capacitor element Cs flows between the drain electrode and the source electrode of the drive transistor Trd. Then, with the supply of this drive current, the organic EL element OEL emits light having a luminance corresponding to the amount of drive current.

[Problem in Threshold Voltage Compensation]

FIG. 3 is a diagram showing variations in voltage of the source electrodes of the drive transistors Trd during the threshold voltage compensation period according to the comparative example. The graph shown in FIG. 3 corresponds to the graph surrounded by a dashed line in FIG. 2. It should be noted that although the diagram of FIG. 2 illustrates a single element, the diagram of FIG. 3 illustrates three elements each of which has a different threshold voltage.

As shown in FIG. 3, in the case of a display pixel in which the threshold voltage of the drive transistor Trd is Vth1, it takes a time Tth1 for the voltage value to reach a value expressed as VREF−Vth1. In the case of a display pixel in which the threshold voltage of the drive transistor Trd is Vth2, it takes a time Tth 2 for the voltage value to reach a value expressed as VREF−Vth2. In the case of a display pixel in which the threshold voltage of the drive transistor Trd is Vth3, it takes a time Tth 3 for the voltage value to reach a value expressed as VREF−Vth3. In FIG. 3, these times are expressed as Tth1>Tth2>Tth3.

With the increase in resolution and size of organic EL displays in recent years, one horizontal scanning period (hereinafter, referred to as "1 H") has a trend to be shorter. Assume that a panel drive frequency is represented as Freq and that the number of scanning lines is represented as Vline. Here, without consideration of a blanking period for the sake of simplicity, 1 H is expressed as 1 H=1 sec/Freq/Vline. It can be understood from this expression that 1 H is shorter when the panel drive frequency Freq and the number of scanning lines Vline increase more because of the trend toward higher resolution of the organic EL display.

For example, assume that the threshold voltage compensation period is set at 1 H to provide a sufficient length of time for the light emission period. In this case, when one horizontal scanning period is shorter, the threshold voltage compensation period is shorter as well. Furthermore, with the increase in size of organic EL displays in recent years, the number of scanning lines Vline and the number of display pixels per scanning line are growing. When an organic EL display is larger, the amount of current required for the entire organic EL display to perform the threshold voltage compensation increases. This thereby increases a variation in the time spent on the threshold voltage compensation. Moreover, the larger size of the organic EL display causes the elements of the organic EL display to be disposed at a distance from each other. Thus, the variations in film thickness and film quality resulting from the processes increase, and the variation in threshold voltage among the drive transistors also increases.

To perform threshold voltage compensation with sufficient accuracy, it is necessary to provide a sufficient length of time for the threshold voltage compensation period until the voltage Vth1 of the drive transistor Trd having the longest threshold voltage compensation period shown in FIG. 3 converges. Alternatively, it is important for the voltages of all the drive transistors Trd to converge within 1 H.

However, since a higher-resolution organic EL display causes the threshold voltage compensation period to be shorter as described above, it has become difficult to provide a sufficient length of time for the threshold voltage compensation period. Moreover, a larger size of the organic EL display increases the variation among the drive transistors Trd in the time it takes before the drive transistor Trd converges. On this account, it is difficult for the voltages of all the drive transistors Trd to converge within 1 H.

For this reason, in the case of the drive transistor having the threshold voltage Vth1 shown in FIG. 3 in particular, the threshold voltage compensation period ends before the voltage of the source electrode reaches the value of VREF−Vth1. In other words, the threshold voltage compensation cannot be performed with sufficient accuracy in some cases. Thus, the accuracy of threshold voltage compensation performed by the conventional organic EL display is degraded due to the variation in threshold voltage among the drive transistors.

In view of this, a technology is required that can provide a sufficient accuracy for threshold voltage compensation even when the threshold voltage compensation period is short.

To solve the aforementioned problem, a display device according to an aspect of the present invention includes a display pixel and a control unit which controls driving of the display pixel, wherein the display pixel includes: a light-emitting element; a capacitor element that holds a voltage; a drive transistor that has (i) a gate electrode connected to a first electrode of the capacitor element and (ii) a source electrode connected to a second electrode of the capacitor element and to an anode electrode of the light-emitting element; a first switch element that switches a state between a signal line for supplying a voltage corresponding to a data signal and the first electrode of the capacitor element, between conducting and non-conducting states; and a resistance unit that has a resistance, is able to switch a state between a power line for supplying an initialization voltage and the second electrode of the capacitor element between the conducting and non-conducting states, and is disposed on a current path from a connection point of the second electrode of the capacitor element and the anode electrode of the light-emitting element to the power line, and the control unit corrects a threshold voltage of the drive transistor.

The display device having the above configuration includes: the resistance unit that is able to switch the state between the power line for supplying the initialization voltage and the second electrode of the capacitor element between the conducting and non-conducting states, and is disposed on a current path from the connection point of the second electrode of the capacitor element and the anode electrode of the light-emitting element to the power line.

According to the conventional technology, the voltage of the source electrode of the drive transistor in the initialization period is fixed at a constant value regardless of the threshold voltage of the drive transistor. On the other hand, the display device having the above configuration includes the resistance unit that allows the voltage of the source electrode of the drive transistor to be adjusted according to the amount of variation in the threshold voltage of the drive transistor. With this, the display device having the above configuration can perform threshold voltage compensation with sufficient accuracy.

To be more specific, in the initialization period, a voltage drop corresponding to a flow-through current is caused to the resistance unit of the display device having the above configuration. In other word, the voltage of the source electrode of the drive transistor increases.

When the voltage of the source electrode of the drive transistor increases, an increase in the voltage of the source electrode is small in the threshold voltage compensation that is performed after the initialization period. In other words, a length of time of threshold voltage compensation is reduced. Thus, the display device having the above configuration can perform threshold voltage compensation more reliably without having to extend the threshold voltage compensation period. More specifically, the display device having the above configuration can reduce the threshold voltage compensation period.

To be more specific, the voltage of the source electrode of the drive transistor included in the display device having the above configuration is expressed as VTFT−(VINI+Ron×Id). In this expression, VTFT represents a voltage of the power line VTFT that supplies the drain electrode of the drive transistor with a drive voltage. Moreover; VINI represents a voltage of the power line VINI that supplies the second electrode of the capacitor element with an initialization voltage. Furthermore, Ron represents a resistance value of the resistance unit, and Id represents a value of the flow-through current.

The flow-through current refers to a current that passes through the power line that supplies the initialization voltage, via the drive transistor and the second switch element, from the power line that supplies the drain electrode of the drive transistor with the drive voltage. A value of the flow-through current varies according to the threshold voltage of the drive transistor. More specifically, the value of the flow-through current is smaller when the threshold voltage is larger, and is larger when the threshold voltage is smaller.

Thus, according to the display device having the above configuration, when the threshold voltage is larger, the value expressed as Ron×Id (the amount of voltage drop in the resistance unit) is smaller and the voltage of the source electrode of the drive transistor at the start of the threshold voltage compensation period provided after the initialization period is smaller. Each of the initial values of graphs a1 to a3 shown in FIG. 3 increases with the value of the threshold voltage. In FIG. 3, the voltages of the source electrodes of all the drive transistors are the same at the start of the threshold voltage compensation period. However, with the display device having the above configuration, the initial value of the graph a1 having the small threshold voltage Vth1 is smaller than the initial value of the graph a3 having the large threshold voltage Vth3. With this, when the threshold voltage is smaller, a length of time for the source electrode of the drive transistor to reach the value of VREF−Vth is shorter than the conventional case. Thus, for a display pixel that has a smaller threshold voltage Vth and a longer threshold voltage compensation period in which the voltage of the source electrode of the drive transistor reaches a desired voltage, the length of time of threshold voltage compensation can be reduced as compared to the comparative example.

To be more specific, even when the threshold voltage compensation period is reduced because of the increase in size and resolution, the display device having the above configuration can perform threshold voltage compensation with sufficient accuracy.

For example, the resistance value of the resistance unit may be set at a value so that the amount of variation in the voltage between the gate electrode and the source electrode of the drive transistor at the start of the threshold voltage compensation period is 0.3 to 0.7 times as much as the amount of variation in the threshold voltage of the drive transistor.

Here, it is preferable for the resistance value of the resistance unit to be set at a value that achieve the following: that the threshold voltage compensation period can be adequately reduced; that a layout size of the resistance unit does not exceed a layout size of one pixel (display pixel PX); and that the application of an initialization voltage required for threshold voltage compensation is allowed. To be more specific, assume that the resistance value of the resistance unit is set at a value so that the amount of variation in the gate-source voltage of the drive transistor at the start of the threshold voltage compensation period with respect to the amount of variation in the threshold voltage of the drive transistor (=∂Vgs/∂Vth) is 0.3 or more. In this case, the threshold voltage compensation period can be adequately reduced. Moreover, assume that the resistance value of the resistance unit is set at a value so that the value of ∂Vgs/∂Vth is 0.7 or less. In this case, an increase in the layout size by the addition of the resistance unit can be suppressed and the initialization voltage required for threshold voltage compensation can be applied.

For example, the resistance unit may be a transistor. Moreover, the transistor may be a second switch element that switches the state between the power line for supplying the initialization voltage and the second electrode of the capacitor element, between the conducting and non-conducting states. Furthermore, the second switch element may have a higher On resistance than any other switch element, and may have a smaller width-to-length (W/L) ratio than any other switch element.

When the second switch element and the resistance unit are combined in one unit using a transistor that has a larger On resistance than any other switch element, the number of components can be reduced. More specifically, the width-to-length (W/L) ratio of the transistor forming the second switch element may be made smaller than the W/L ratio of any other switch element.

For example, the resistance unit may include: a second switch element that switches the state between the power line for supplying the initialization voltage and the second electrode of the capacitor element, between the conducting and non-conducting states; and a resistance element that is connected to the second switch element in series.

With the placement of another element different from the second switch element, the second switch element can be used as a switch. Moreover, since only a resistance element is required, the device configuration can be prevented from being complex.

For example, the resistance unit may be shared among a plurality of the display pixels.

When the resistance unit is shared among the plurality of display pixels, the additional circuit can be small in size.

Moreover, a display device control method according to an aspect of the present invention is a display device control method for controlling a display device that includes a display pixel and a control unit that controls driving of the display pixel, the display pixel including: a light-emitting element; a capacitor element that holds a voltage; a drive transistor that has (i) a gate electrode connected to a first electrode of the capacitor element and (ii) a source electrode connected to a second electrode of the capacitor element and to an anode electrode of the light-emitting element; a first switch element that switches a state between a signal line for supplying a voltage corresponding to a data signal and the first electrode of the capacitor element, between conducting and non-conducting states; and a resistance unit that has a resistance, is able to switch a state between a power line for supplying an initialization voltage and the second electrode of the capacitor element between the conducting and non-conducting states, and is disposed on a current path from a connection point of the second electrode of the capacitor element and the anode electrode of the light-emitting element to the power line, and the method including: applying, by the control unit, a drive voltage to a drain electrode of the drive transistor to drive the light-emitting element, while applying the initialization voltage to the second electrode by applying a reference voltage to the first electrode of the capacitor element and by setting the second switch element in the conducting state; and setting, by the control unit, the second switch element in the non-conducting state after the applying of the drive voltage, while maintaining the application of the reference voltage to the first electrode and maintaining the application of the drive voltage to the drain electrode of the drive transistor.

As with the display device described above, the present control method can also deal with the variation in the threshold voltage of the drive transistor using a simple configuration without an increase in the manufacturing cost.

For example, the applying of the drive voltage may include: applying the initialization voltage to the second electrode by applying the reference voltage to the first electrode of the capacitor element and by setting the second switch element in the conducting state, while the application of the drive voltage to the drain electrode of the drive transistor is stopped; and starting the application of the drive voltage to the drain electrode of the drive transistor after the applying of the initialization voltage, while maintaining the application of the reference voltage to the first electrode and maintaining the second switch element in the conducting state.

The applying of the initialization voltage and the starting of the application of the drive voltage are executed in the display device having the above configuration. Thus, the resistance unit allows the voltage of the source electrode of the drive transistor to be adjusted according to the amount of variation in the threshold voltage of the drive transistor.

For example, in the starting of the application of the drive voltage, the control unit may perform control to cause a voltage applied to a gate electrode of the second switch element to be lower than a voltage applied to a gate electrode of any other switch element. Alternatively, the second switch element may a transistor, and the control unit may perform control to cause a voltage applied to a gate electrode of the second switch element in the starting of the application of the drive voltage to be lower than a voltage applied to the gate electrode of the second switch element in the applying of the initialization voltage.

When the second switch element in the display device having the above configuration is combined into one unit using a transistor, the number of components can be reduced. Moreover, a favorable voltage drop can be caused to the second switch element.

Hereinafter, an embodiment is specifically described with reference to the drawings.

It should be noted that each of embodiments described below shows a general or specific example. The numerical values, shapes, materials, structural elements, the arrangement and connection of the structural elements, steps, the processing order of the steps, and so forth described in the embodiments below are mere examples, and are not intended to limit the present invention. Thus, among the structural elements in the embodiments below, structural elements not recited in any one of the independent claims indicating top concepts according to the present invention are described as arbitrary structural elements.

(Embodiment)

An organic EL display according to an embodiment is described, with reference to FIG. 4 to FIG. 20.

The organic EL display according to the present embodiment includes a resistance unit that has a resistance and that is configured to be able to switch a state between a power line for supplying an initialization voltage and a second electrode of a capacitor element between a conducting state and a non-conducting state. The resistance unit is disposed on a current path from a connection point of the second electrode of the capacitor element and an anode electrode of a light-emitting element to the power line. With this, after the end of a first initialization period, a voltage corresponding to a variation in threshold voltage can be applied to a source electrode of a drive transistor before the start of a threshold voltage compensation period.

[1. Configuration of Organic EL Display]

Figure 4:
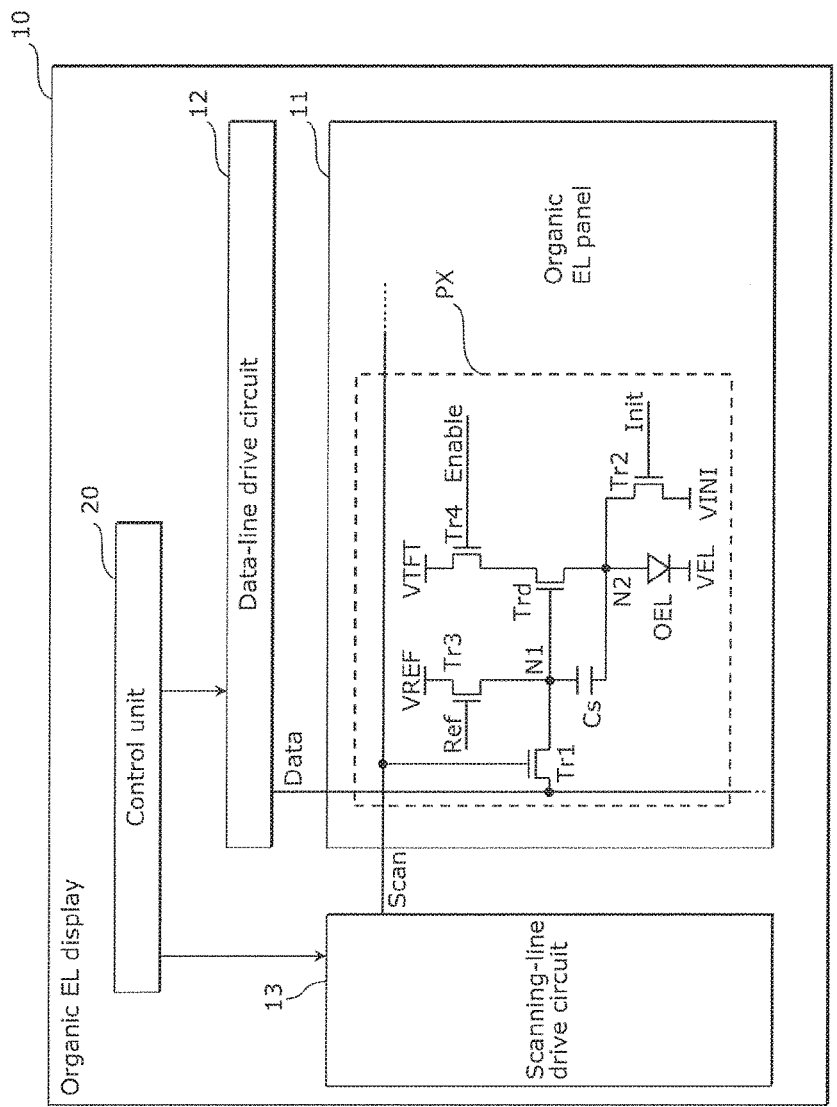
FIG. 4 is a block diagram showing an example of a configuration of an organic EL display according to an embodiment.

FIG. 4 is a block diagram showing an example of a configuration of an organic EL display 10 according to the present embodiment. As shown in FIG. 4, the organic EL display 10 includes an organic EL panel 11, a data-line drive circuit 12, a scanning-line drive circuit 13, and a control unit 20.

The organic EL panel 11 includes a plurality of display pixels PX arranged in a matrix, as with the organic EL panel 110 according to the comparative example. It should be noted that a display pixel PX is a subpixel that corresponds to one color, as in the comparative example. One pixel is formed from three subpixels corresponding to red, green, and blue, respectively.

The display pixel PX includes an organic EL element OEL, a capacitor element Cs, a drive transistor Trd, a first switch element Tr1, a second switch element Tr2, a third switch element Tr3, and a fourth switch element Tr4. The structural elements of the display pixel PX are identical to those in the comparative example, except for the second switch element Tr2.

The organic EL element OEL is a light-emitting element that emits light corresponding to a drive current, as with the organic EL element OEL according to the comparative example. The drive current is supplied from the drive transistor Trd. The organic EL element OEL includes: an anode electrode connected to a source electrode of the drive transistor Trd; and a cathode electrode connected to a power line VEL.

The capacitor element Cs stores an electrical charge corresponding to a voltage of a data line Data, as with the capacitor element Cs according to the comparative example. The capacitor element Cs includes: a first electrode connected to a gate electrode of the drive transistor; and a second electrode connected to the source electrode of the drive transistor Trd.

The drive transistor Trd supplies the organic EL element OEL with a drive current corresponding to the charge quantity that is stored in the capacitor element Cs according to the voltage of the data line Data, as with the drive transistor Trd according to the comparative example. The drive transistor Trd is a thin film transistor and includes: the gate electrode connected to the first electrode of the capacitor element Cs; the source electrode connected to the anode electrode of the organic EL element OEL; and a drain electrode connected to a power line VTFT that supplies a drive voltage.

The first switch element Tr1 switches a state of the display pixel PX between a selected state and an unselected state, by switching a state between the data line Data and the first electrode of the capacitor element Cs between the conducting state and the non-conducting state according to a voltage of a scanning line Scan, as with the first switch element Tr1 according to the comparative example. To be more specific, the first switch element Tr1 is a thin film transistor and includes: a gate electrode connected to the scanning line Scan; a source electrode connected to the data line Data; and a drain electrode connected to the first electrode of the capacitor element Cs.

The second switch element Tr2 switches a state between the second electrode (a node N2) of the capacitor element Cs and a power line VINI that supplies an initialization voltage between the conducting state and the non-conducting state, according to a voltage of a signal line Init. The second switch element Tr2 is a thin film transistor and has a higher On resistance than the other switch elements. It should be noted that, in the first initialization period, the control unit 20 according to the present embodiment brings the fourth switch element Tr4 out of conduction and controls only charging and discharging of the capacitor element Cs. To be more specific, the second switch element Tr2 is caused to function as a switch instead of a resistance. Moreover, in a second initialization period, the control unit 20 causes the second switch element Tr2 to function as a resistance by bringing the fourth switch element Tr4 into conduction and passing a flow-through current through the second switch element Tr2. To be more specific, the second switch element Tr2 functions as the aforementioned resistance unit in the second initialization period. The second switch element Tr2 is described in detail later.

The third switch element Tr3 switches a state between the first electrode (a node N1) of the capacitor element Cs and a power line VREF that supplies a reference voltage between the conducting state and the non-conducting state according to a voltage of a signal line Ref, as with the third switch element Tr3 according to the comparative example.

The fourth switch element Tr4 switches a state between the drain electrode of the drive transistor Trd and the power line VTFT between the conducting state and the non-conducting state according to a voltage of a signal line Enable, as with the fourth switch element Tr4 according to the comparative example.

The data-line drive circuit 12 supplies a plurality of data lines Data with a voltage corresponding to a data signal received from the control unit 200, as in the comparative example.

The scanning-line drive circuit 13 supplies a plurality of scanning lines Scan with a voltage corresponding to a drive signal received from the control unit 200, as in the comparative example.

The control unit 20 is a circuit that controls video display on the organic EL panel 11, as in the comparative example. The control unit 20 is configured with, for example, a TCON (timing controller). It should be noted that the control unit 20 may be configured with a computer system that includes a microcontroller or with a system LSI (large scale integration). The control unit 20 may be realized by means of a program executing unit, such as a CPU or a processor, reading and executing the software program recorded on a recording medium such as a hard disk or a semiconductor memory.

[1-1. Detailed Configuration of Second Switch Element]

The configuration of the second switch element Tr2 is described in detail with reference to FIG. 5 to FIG. 13.

As described above, the second switch element Tr2 according to the present embodiment is the transistor that has a higher On resistance than the other switch elements and functions as the resistance unit in the second threshold voltage compensation period. In other words, the second switch element Tr2 has a smaller W/L ratio than the other switch elements.

To reduce the degradation in the accuracy of threshold voltage compensation due to the variation in the threshold voltage described in Details of Problem above, it is preferable for, for example, the resistance value of the second switch element Tr2 to be set appropriately.

In the present embodiment, a range of a channel width $W_R$ and a range of a channel length $L_R$ are defined to appropriately set the resistance value of the second switch element Tr2.

[1-1-1. Difference in Vth Detection in Comparative Example]

Figure 5:
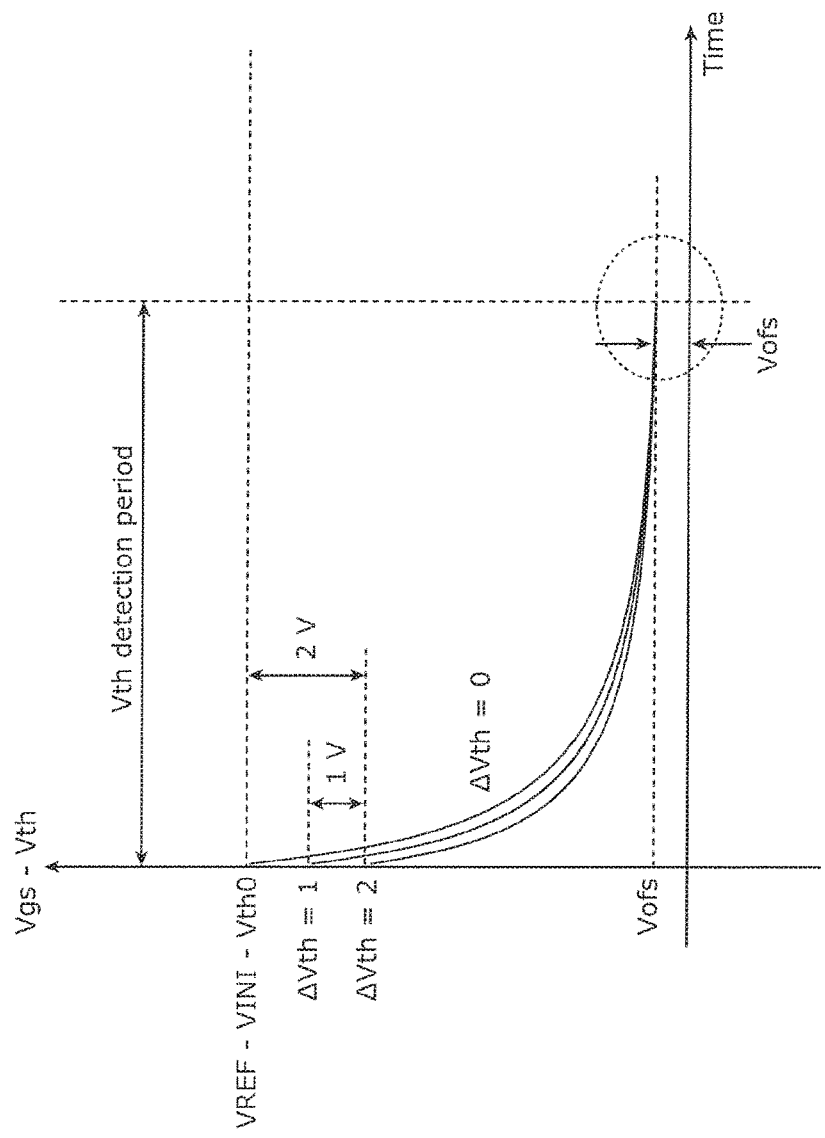
FIG. 5 is a graph showing an ideal time variation in a voltage expressed as Gate-Source Voltage Vgs−Threshold Voltage Vth, in a drive transistor during the threshold voltage compensation period.
Figure 6:
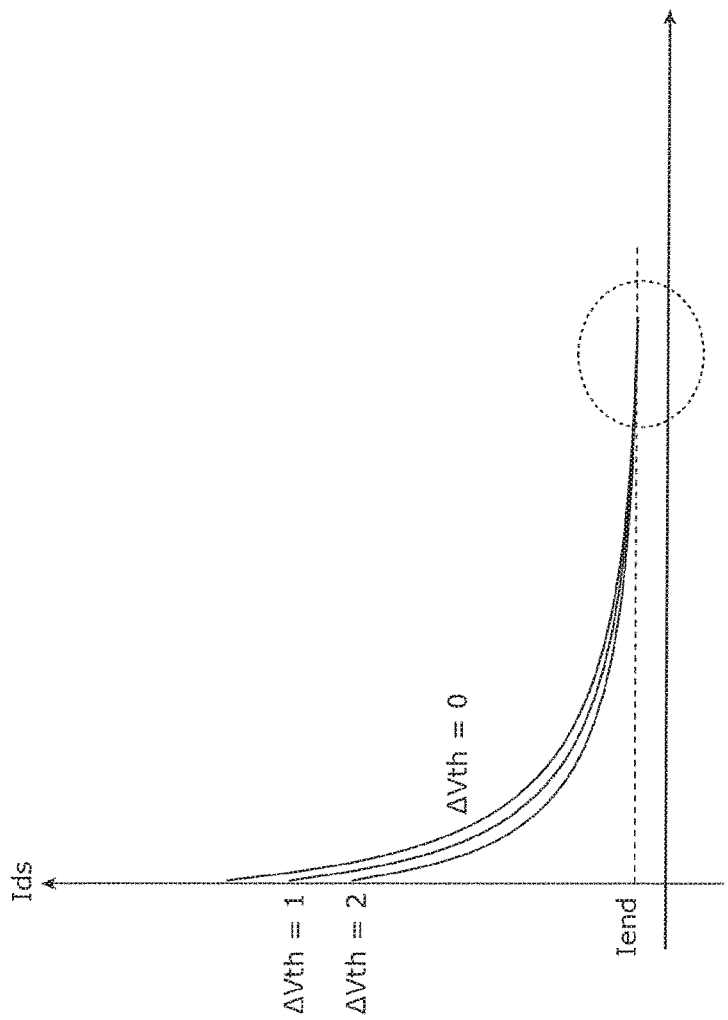
FIG. 6 is a graph showing an ideal time variation in a current Ids flowing between a source electrode and a drain electrode of the drive transistor during the threshold voltage compensation period.

FIG. 5 is a graph showing an ideal time variation in a voltage expressed as Gate-Source Voltage Vgs−Threshold Voltage Vth, in the drive transistor during the threshold voltage compensation period. FIG. 6 is a graph showing an ideal time variation in a current Ids flowing between the source electrode and the drain electrode of the drive transistor during the threshold voltage compensation period. Each of FIG. 5 and FIG. 6 shows the cases where a threshold voltage variation ΔVth is 0 V, 2 V, and 3 V.

As shown in FIG. 5, it is preferable for the voltage expressed as Vgs−Vth to always converge to a voltage Vofs in the threshold voltage compensation period, regardless of the threshold voltage variation ΔVth of the drive transistor Trd. It should be noted that since the threshold voltage compensation period is a finite time period, the voltage expressed as Vgs−Vth does not become absolutely 0 V and thus converges to Vofs.

Similarly, as shown in FIG. 6, it is preferable for the current Ids to converge to a current Iend or a similar current in the threshold voltage compensation period. It should be noted that since the threshold voltage compensation period is a finite time period, the current Ids almost, instead of completely, converges to the current Iend. Here, the current Ids can be calculated from Expression 1 below. Moreover, the current Iend can be calculated from Expression 2 below.

[Math. 1]

$$Ids = \beta \times (Vgs - Vth)^2 \qquad \text{Expression 1}$$

[Math. 2]

$$Iend = \beta \times (Vofs + Vth0 + \Delta Vth - (Vth0 + \Delta Vth))^2 = \beta Vofs^2 \qquad \text{Expression 2}$$

It should be noted that the voltage Vgs is expressed as Vgs=Vofs+Vth, and that the voltage Vth is expressed as Vth=Vth0+ΔVth.

Figure 7:
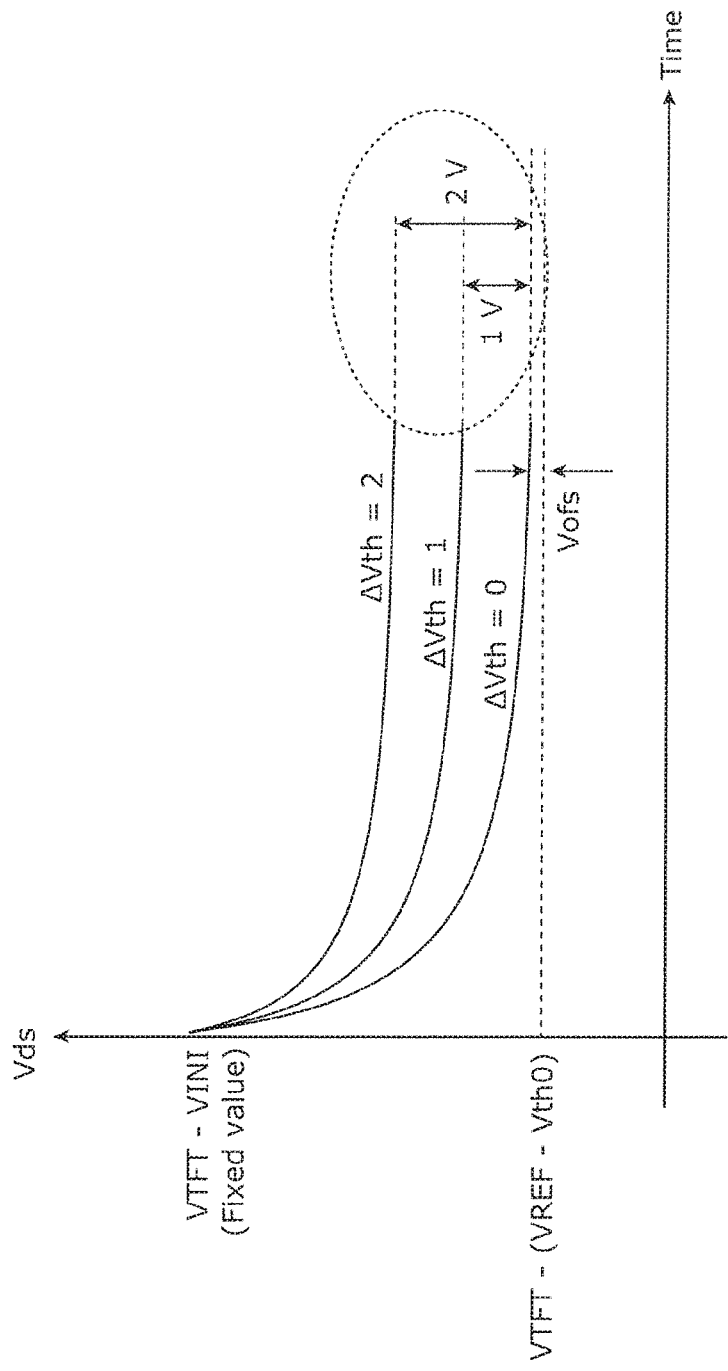
FIG. 7 is a graph showing a time variation in a drain-source voltage of the drive transistor during the threshold voltage compensation period.

In reality, however, the currents Ids at the end of the threshold voltage compensation period do not converge to the same value. FIG. 7 is a graph showing a time variation in a drain-source voltage of the drive transistor during the threshold voltage compensation period. FIG. 7 shows the cases where the threshold voltage variation ΔVth is 0 V, 2 V, and 3 V.

As shown in FIG. 7, when the threshold voltage variation ΔVth is larger, the drain-source voltage Vds of the drive transistor Trd at the end of the threshold voltage compensation period is larger. Thus, when the threshold voltage variation ΔVth is larger, the convergence current Iend is larger.

Figure 8:
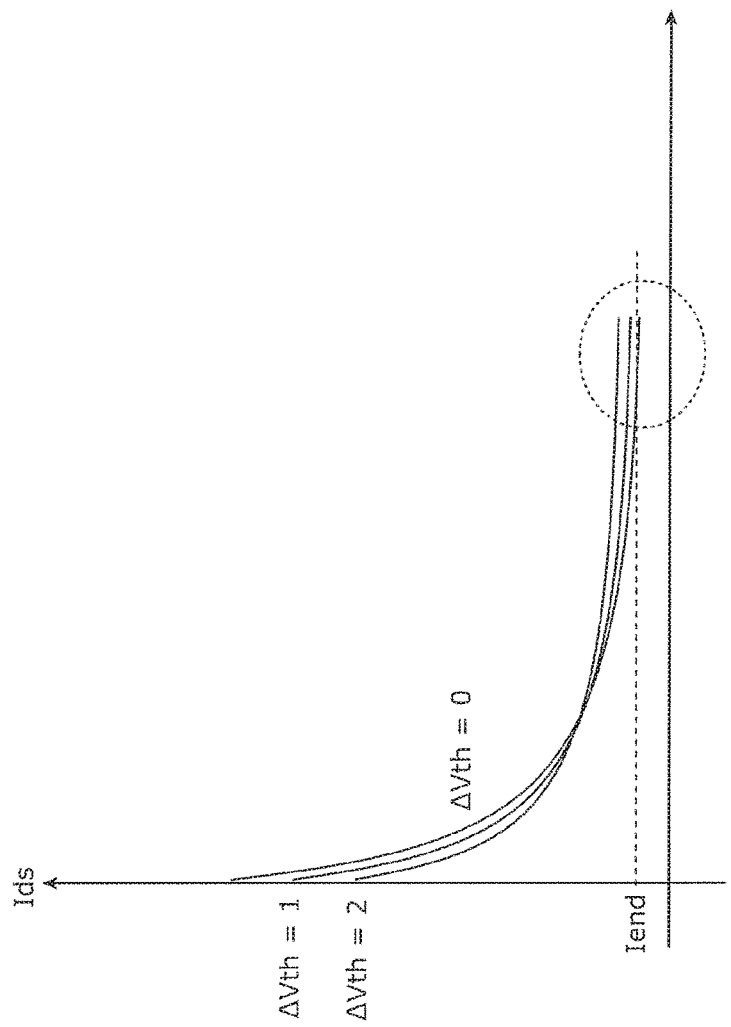
FIG. 8 is a graph showing an actual time variation in the current Ids flowing between the source electrode and the drain electrode of the drive transistor during the threshold voltage compensation period.

FIG. 8 is a graph showing an actual time variation in the current Ids flowing between the source electrode and the drain electrode of the drive transistor Trd during the threshold voltage compensation period. The current Ids can be calculated from Expression 3 below.

[Math. 3]

$$Ids = \beta \times Vofs^2 \times (1 + \lambda \times Vds) \qquad \text{Expression 3}$$

Ideally, it is preferable for the currents Ids to converge to the current Iend at the end of the threshold voltage compensation period even when the threshold voltage variations are different as shown in FIG. 6. In reality, however, the current Ids at the end of the threshold voltage compensation period varies according to the variation in Vds resulting from the threshold voltage variation ΔVth, as shown in FIG. 8. On this account, the voltage expressed as Vgs−Vth also varies at the end of the threshold voltage compensation period.

Figure 9:
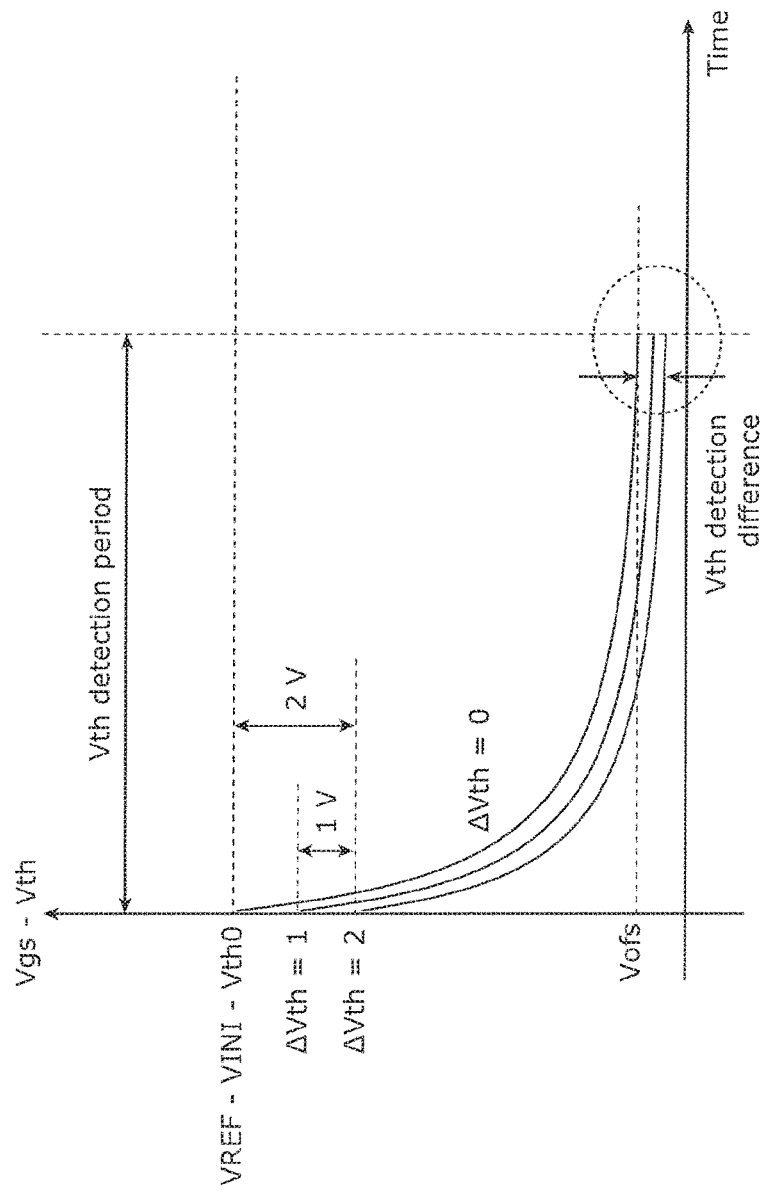
FIG. 9 is a graph showing an actual time variation in the voltage expressed as Gate-Source Voltage Vgs−Threshold Voltage Vth, in the drive transistor during the threshold voltage compensation period.

FIG. 9 is a graph showing an actual time variation in the voltage expressed as Gate-Source Voltage Vgs−Threshold Voltage Vth, in the drive transistor Trd during the threshold voltage compensation period. As shown in FIG. 9, when the threshold voltage variation ΔVth is larger, the amount of current flowing between the source electrode and the drain electrode is larger and thus the voltage expressed as Vgs−Vth is smaller. In other words, a threshold detection difference is caused, which leads to degradation in the accuracy of threshold voltage compensation.

[1-1-2. Channel Width and Channel Length of Second Switch Element Tr2]

In view of this, the voltage expressed as Vgs–Vth is adjusted in the initialization period to be larger at the start of the threshold voltage compensation period when the threshold voltage variation ΔVth is larger, according to the present embodiment. To be more specific, the initialization voltage is adjusted at the end of the initialization period to allow the voltage Vgs–Vth to be larger when the threshold voltage variation ΔVth is larger.

To adjust the initialization voltage, the display pixel PX according to the present embodiment includes the resistance unit described above. As shown in FIG. 4, the resistance unit is disposed on the current path from the node N2 that is the connection point of the second electrode of the capacitor element Cs and the anode electrode of the organic EL element OEL to the power line VINI. The resistance unit according to the present embodiment is implemented by allowing the second switch element Tr2 (the thin film transistor) to have a larger On resistance than the other switch elements. With this, the voltage of the source electrode of the drive transistor Trd can be adjusted according to the threshold voltage variation ΔVth of the drive transistor Trd.

The following describes a method of adjusting the voltage of the source electrode of the drive transistor Trd.

In the initialization period, when the first switch element Tr1 is brought into an Off state and the second switch element Tr2, the third switch element Tr3, and the fourth switch element Tr4 are brought into an On state, a flow-through current Id flows through the power line VINI from the power line VTFT via the drive transistor Trd and the second switch element Tr2.

At this rime,the voltage of the source electrode of the drive transistor Trd is expressed as VTFT−(VINI+Ron×Id). In this expression, VTFT represents the voltage of the power line VTFT that supplies the drain electrode of the drive transistor with the drive voltage, as described above. Moreover, VINI represents the voltage of the power line VINI that supplies the second electrode of the capacitor element Cs with the initialization voltage, as described above. Furthermore, Ron represents the resistance value of the resistance unit, as described above.

The flow-through current Id varies according to the threshold voltage Vth of the drive transistor Trd. More specifically, the flow-through current Id is smaller when the threshold voltage Vth of the drive transistor Trd is larger, and is larger when the threshold voltage Vth is smaller.

Thus, when the threshold voltage Vth is larger, the value expressed as Ron×Id (the amount of voltage drop in the resistance unit) is smaller. Then, the voltage of the source electrode of the drive transistor is smaller at the end of the initialization period and subsequently at the start of the threshold voltage compensation period.

More specifically, the placement of the resistance unit enables the voltage of the source electrode of the drive transistor Trd to be adjusted according to the variation ΔVth in the threshold voltage Vth of the drive transistor Trd.

The resistance value of the resistance unit (the resistance value of the second switch element Tr2 in the present embodiment) is set to satisfy Expression 4 below.

[Math. 4]

$$0.3 \leq \frac{\partial Vgs}{\partial Vth} = \alpha \leq 0.7 \quad \text{Expression 4}$$

Here, by setting the value of ∂Vgs/∂Vth at 0.3 or more, the variation in the threshold voltage can be adequately reflected on the voltage of the source electrode. Moreover, by setting the value of ∂Vgs/∂Vth at 0.7 or less, the following can be achieved. The layout size of the resistance unit does not exceed the layout size of one pixel (display pixel PX) and thus the impossibility of the layout can be prevented. In addition, the voltage drop in the resistance unit is prevented from becoming excessively large, and a voltage difference having an appropriate amplitude as the initial value in the threshold voltage compensation period can be given to the capacitor element Cs. It should be noted that a basis of setting the value between 0.3 and 0.7 inclusive is described later.

Here, the flow-through current Id can be calculated from Expression 5 below. In Expression 5, $W_D$ represents the channel width of the drive transistor Trd, $L_D$ represents the channel length of the drive transistor Trd, $\mu_D$ represents an electron mobility of the drive transistor Trd, and Cox represents a capacity of a gate oxide film per unit area. Moreover, Vgs can he calculated from Expression 6 below.

[Math. 5]

$$Id = \frac{\mu_D \times Cox}{2} \times \frac{W_D}{L_D} \times (Vgs - Vth)^2 \quad \text{Expression 5}$$

[Math. 6]

$$Vgs = VREF - (VINI + Id \times Ron) \quad \text{Expression 6}$$

Substitution of Expression 6 into Expression 5 yields Expression 7 and Expression 8 below.

[Math. 7]

$$Id = b - \sqrt{b^2 - \frac{(VREF - VINI - Vth)^2}{Ron^2}} \quad \text{Expression 7}$$

[Math. 8]

$$b = \frac{(VREF - VINI - Vth)}{Ron} + \frac{1}{\mu_D \times Cox \times \frac{W_D}{L_D} \times Ron^2} \quad \text{Expression 8}$$

Here, Vgs can be calculated from Expression 9 below that is derived from the above description.

[Math. 9]

$$Vgs = VREF - VINI - Ron \times b + \sqrt{Ron^2 \times b^2 - Ron \times (VREF - VINI - Vth)^2} \quad \text{Expression 9}$$

Substitution of Expression 9 into Expression 4 yields Expression 10 below.

[Math. 10]

$$0.3 \leq \cfrac{1}{\sqrt{2 \times \mu_D \times Cox \times \cfrac{W_D}{L_D} \times Ron \times (VTFT - VINI - Vth)} + 1} \leq 0.7 \quad \text{Expression 10}$$

Here, since the second switch element Tr2 is the transistor that operates in a linear region, Expression 11 to Expression 13 below are established.

[Math. 11]

$$Id = \frac{\mu_R \times Cox \times W_R}{L_R}\left(Vgs_R - Vth_R - \frac{Vds_R}{2}\right) \times Vds_R \quad \text{Expression 11}$$

[Math. 12]

$$Ron = \frac{Vds_R}{Id} \quad \text{Expression 12}$$

[Math. 13]

$$Vgs_R = Vgh_R - VINI \quad \text{Expression 13}$$

In Expression 11 to Expression 13, $W_R$ represents the channel width of the second switch element Tr2; $L_R$ represents the channel length of the second switch element Tr2, and $\mu_R$ represents the electron mobility of the second switch element Tr2. Moreover, $Vgs_R$ represents the gate-source voltage of the second switch element Tr2, $Vth_R$ represents the threshold voltage of the second switch element Tr2, $Vds_R$ represents the drain-source voltage of the second switch element Tr2, and $Vgh_R$ is the voltage of the gate electrode (the voltage of Init) when the second switch element Tr2 is in the On state. Substitution of Expression 11 to Expression 13 above into Expression 10 yields Expression 14 below.

[Math. 14]

$$\left(\frac{10}{7}\right)^2 \leq 1 - \frac{2 \times \mu_D \times \frac{W_D}{L_D} \times (VTFT - VINI - Vth)}{\mu_R \times \frac{W_R}{L_R} \times (Vgh_R - VINI - Vth_R)} \leq \left(\frac{10}{3}\right)^2 \quad \text{Expression 14}$$

where $$Vgh_R - VINI - Vth_R - \frac{Vds_R}{2} \approx Vgh_R - VINI - Vth_R$$

The channel width $W_R$ and the channel length $L_R$ of the second switch element Tr2 are set to satisfy Expression 14.

Figure 10:
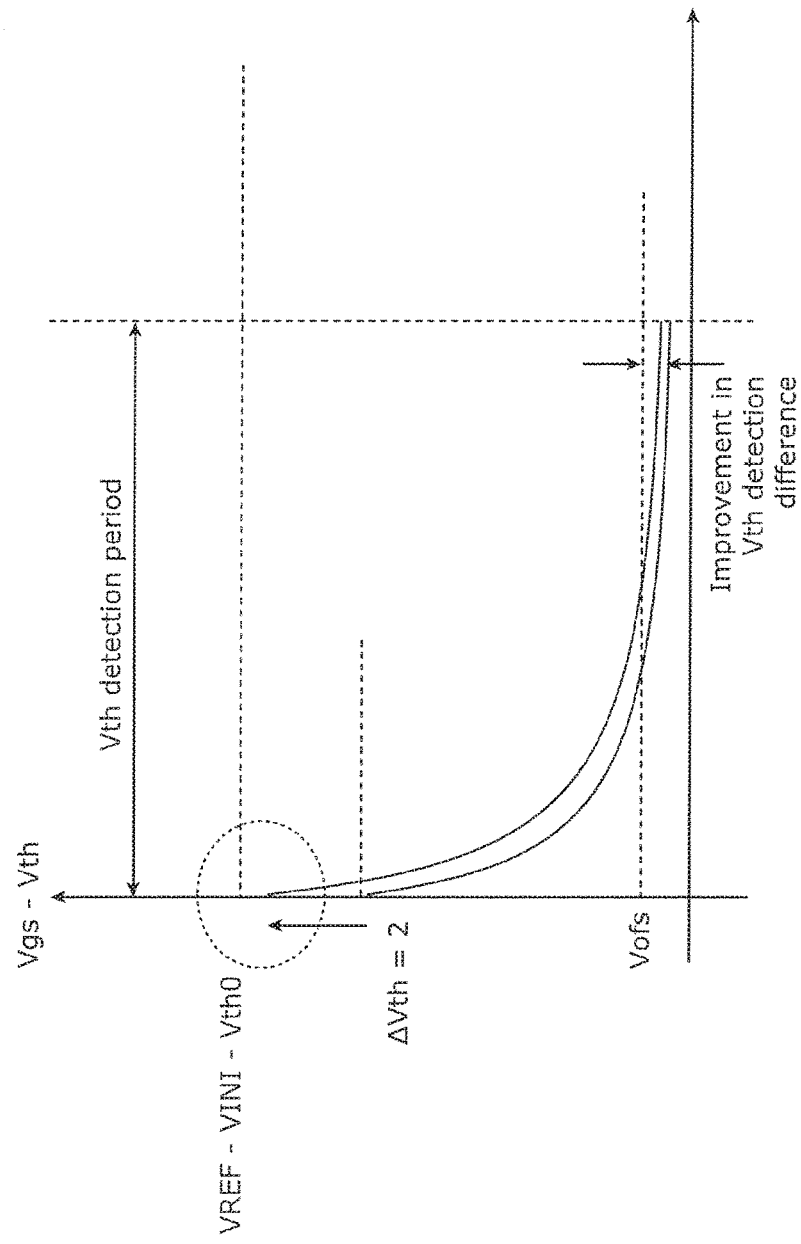
FIG. 10 is a graph showing transitions of the voltage expressed as Vgs−Vth during the threshold voltage compensation period according to a comparative example and the embodiment.
Figure 11:
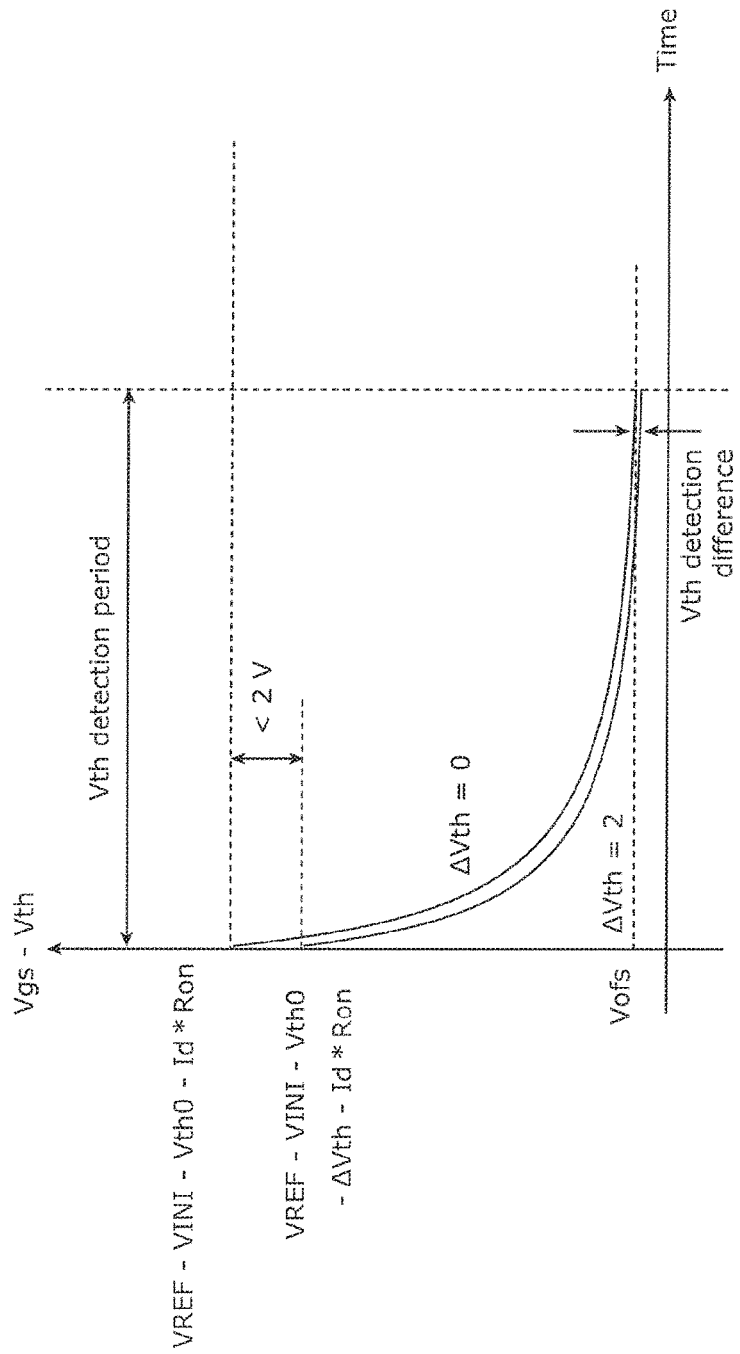
FIG. 11 is a graph showing a difference in Vth detection (threshold voltage compensation value) between when a threshold voltage variation ΔVth is 0 V and when the threshold voltage variation ΔVth is 2 V, according to the embodiment.
Figure 12:
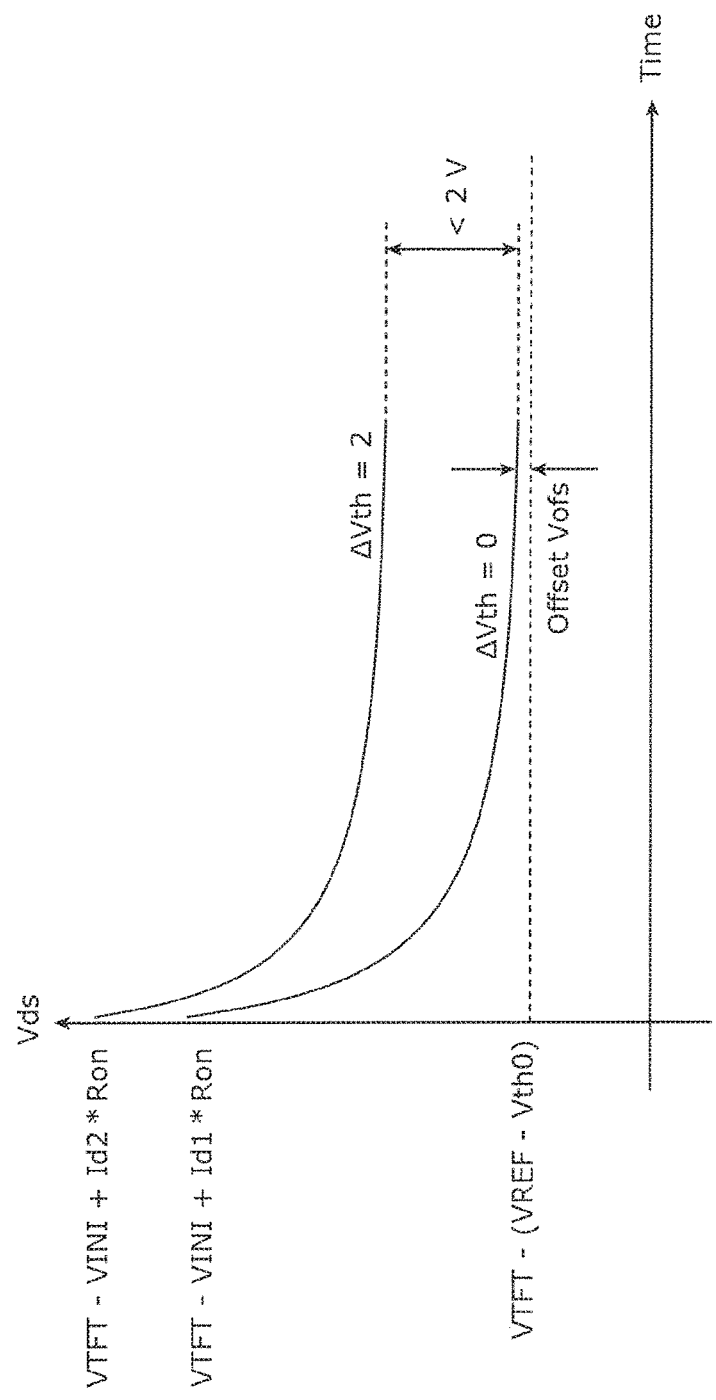
FIG. 12 is a graph showing a time variation in the drain-source voltage of the drive transistor during the threshold voltage compensation period according to the embodiment.

FIG. 10 is a graph showing transitions of the voltage expressed as Vgs−Vth during the threshold voltage compensation period according to a comparative example and the present embodiment. FIG. 10 shows the case where the threshold voltage variation ΔVth is 2 V. FIG. 11 is a graph showing a difference in Vth detection between when the threshold voltage variation ΔVth is 0 V and when the threshold voltage variation ΔVth is 2 V, according to the present embodiment. FIG. 12 is a graph showing a time variation in the drain-source voltage of the drive transistor Trd during the threshold voltage compensation period according to the present embodiment. FIG. 12 shows the cases where the threshold voltage variation ΔVth is 0 V and 2 V.

As shown in FIG. 10, the graph according to the present embodiment has a larger initial value than the graph according to the comparative example. Thus, the value of the threshold detection at the end of the threshold voltage compensation period is close to Vofs. As can be seen in FIG. 11, the variation in threshold detection at the end of the threshold voltage compensation period is reduced according to the present embodiment, as compared to the comparative example. As shown in FIG. 12, a difference in Vds is 2 V or less between when ΔVth is 0 V and when ΔVth is 2 V.

[1-1-3. Range Setting for Variation in Vgs with Respect to Variation in Threshold Voltage Vth]

(1) Setting of a lower limit (0.3, for example) of ∂Vgs/∂Vth in Expression 4 is described.

Firstly, a time TthMax that is required for Vth detection according to a comparative example is described. According to the comparative example, a gate-source voltage Vinit of the drive transistor Trd at the start of the threshold voltage compensation period is calculated from Expression 15 below.

[Math. 15]

$$Vinit = VthMax + VthM \text{arg in} \quad \text{Expression 15}$$

Here, VthMax represents the value of the threshold voltage Vth of the display pixel PX that has the largest threshold voltage Vth of the drive transistor Trd among all the display pixels forming the organic EL panel 11. Moreover, VthMargin represents a voltage margin that is required for threshold voltage compensation. Next, as can be seen from FIG. 3, when the threshold voltage Vth is the smallest, the time it takes to perform Vth detection is the longest. In view of this, the time Tthmax required for Vth detection when the threshold voltage Vth is the smallest is calculated. Firstly, a charge quantity Qmax that is charged by Vth detection is calculated from Expression 16 below.

[Math. 16]

$$Qmax = (Vinit - VthMin) \times Cs \quad \text{Expression 16}$$

Here, VthMin represents the value of the threshold voltage Vth of the display pixel PX that has the smallest threshold voltage Vth of the drive transistor Trd among all the display pixels forming the organic EL panel 11. The time TthMax required to charge the charge quantity Qmax is calculated from Expression 17 below.

[Math. 17]

$$TthMax = \frac{Qmax}{Id} \quad \text{Expression 17}$$

Here, Id represents a mean value of the current passing through the capacitor element Cs via the drive transistor Trd during the threshold voltage compensation period. As explained in Details of Problem above, when the threshold voltage compensation period is, for example, equal to one horizontal scanning period (1 H), it is preferable for TthMax to be equal to or less than 1 H. Substitution of Expression 16 and Expression 15 into Expression 17 yields Expression 18 below.

[Math. 18]

$$TthMax = (VthM \arg in + VthMax - VthMin) \times \frac{Cs}{Id} \leq 1H \quad \text{Expression 18}$$

Next, the time TthMax required for Vth detection according to the present embodiment is described. As described above, Vinit varies with the factor α (=∂Vgs/∂Vth) with respect to Vth according to the present embodiment. Thus, Expression 19 below is established for the display pixel PX in which the threshold voltage of the drive transistor Trd is VthMax.

[Math. 19]

$$Vinit = VthMax + VthM \arg in - (VthMax - VthMin) \times \alpha \quad \text{Expression 19}$$

From Expression 18 and Expression 19, Expression 20 below is established.

[Math. 20]

$$TthMax = \left\{ VthM \arg in + (VthMax - VthMin) \times (1 - \alpha) \right\} \times \frac{Cs}{Id} \leq 1H \quad \text{Expression 20}$$

As can be understood from Expression 18 and Expression 20, the organic EL display according to the present embodiment has the TthMax that is smaller by a factor of (1−α) than the comparative example. Thus, it is easy to make the threshold voltage compensation period equal to or less than one horizontal scanning period (1 H).

The present inventors performed verification on the organic EL panel 11 that is a 40-inch 4K2K panel (for example, 3480×2160 display pixels). This organic EL panel 11 had the following: 0 V to 2 V as the in-plane variation in the threshold voltage of the drive transistor Trd; 2.5 V as VthMargin; and 0.5 pF as the capacitor element Cs. In this case, the mean value Id of the current passing through the capacitor element Cs via the drive transistor Trd during the threshold voltage compensation period was 0.25 µA.

Figure 13:
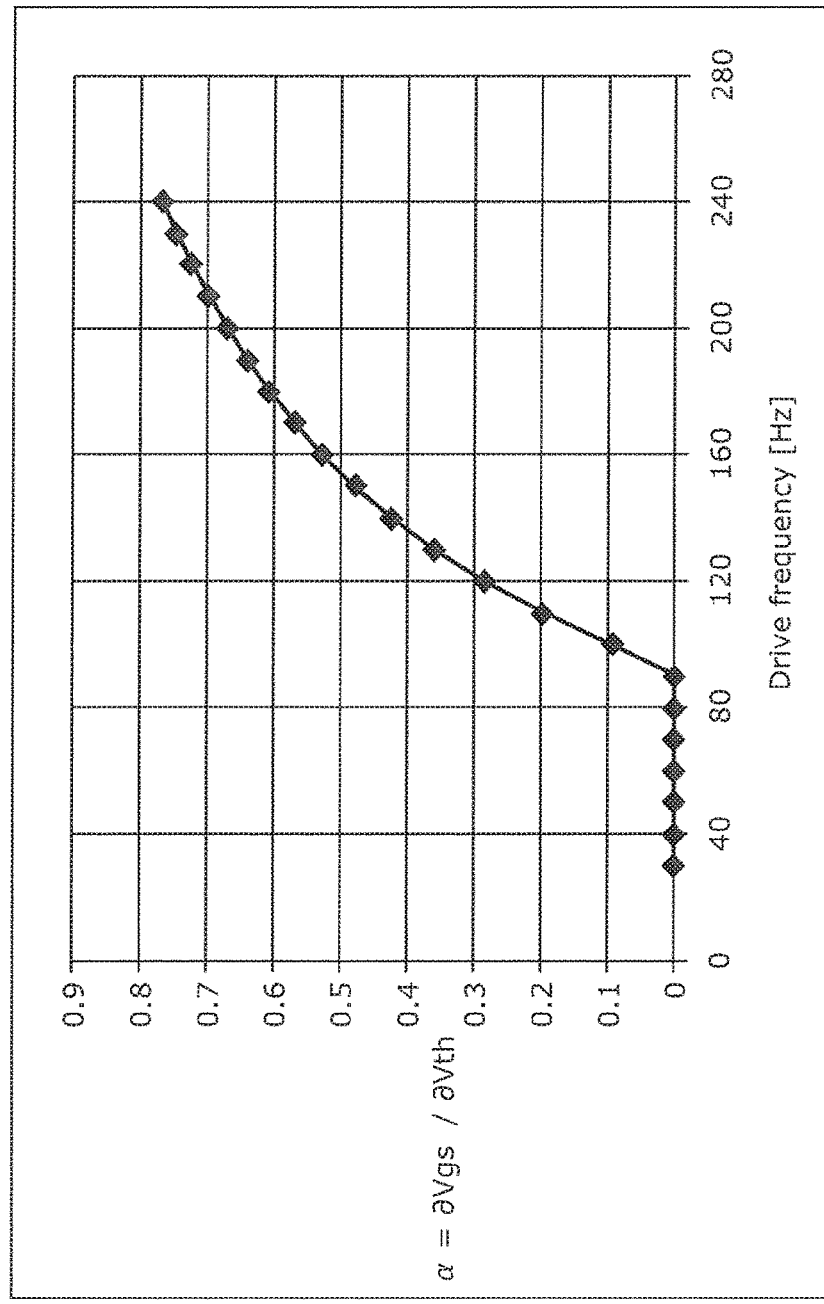
FIG. 13 is a graph showing a result of calculating a value a required for each drive frequency Freq when the number of scanning lines Vline is 2160.

FIG. 13 is a graph showing a result of calculating the value α required to satisfy Expression 20 for each drive frequency Freq when the number of scanning lines Vline is 2160. As can be seen from FIG. 13, it is preferable for α to be 0.3 or more when the drive frequency is 120 Hz.

Figure 14:
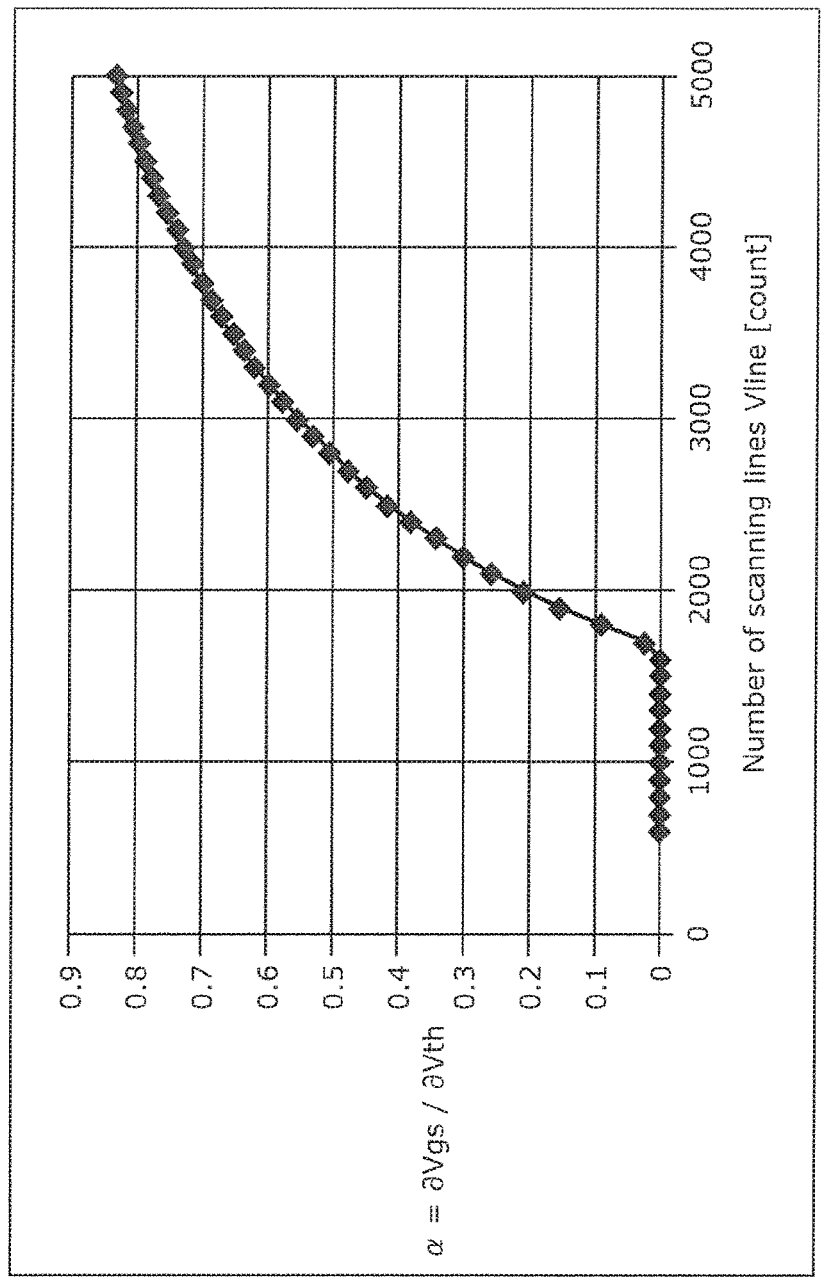
FIG. 14 is a graph showing a result of calculating the value a required for each set of scanning lines Vline when the drive frequency Freq is fixed to 120 Hz.

FIG. 14 is a graph showing a result of calculating the value α required to satisfy Expression 20 for each set of the scanning lines Vline when the drive frequency Freq is fixed to 120 Hz. As can be seen from FIG. 14, it is preferable for α to be 0.3 or more when the number of scanning lines Vline is 2160.

From the description thus far, to cause the voltage of the source electrode of the drive transistor Trd to converge within the threshold voltage compensation period, it is preferable to satisfy α≥0.3 when the panel satisfies the following: the number of scanning lines Vline≥2160; and the drive frequency Freq≥120 Hz.

Although the present embodiment describes the 40-inch 4K2K panel, the lower limit of α may be set at a different value when the organic EL panel 11 has a different condition, such as that the number of Vline is less than 2160. It is preferable to make the setting according to constrains of the organic EL panel 11 to be designed.

(2) Setting of an upper limit (0.7, for example) of ∂Vgs/∂Vth in Expression 4 is described.

Figure 15:
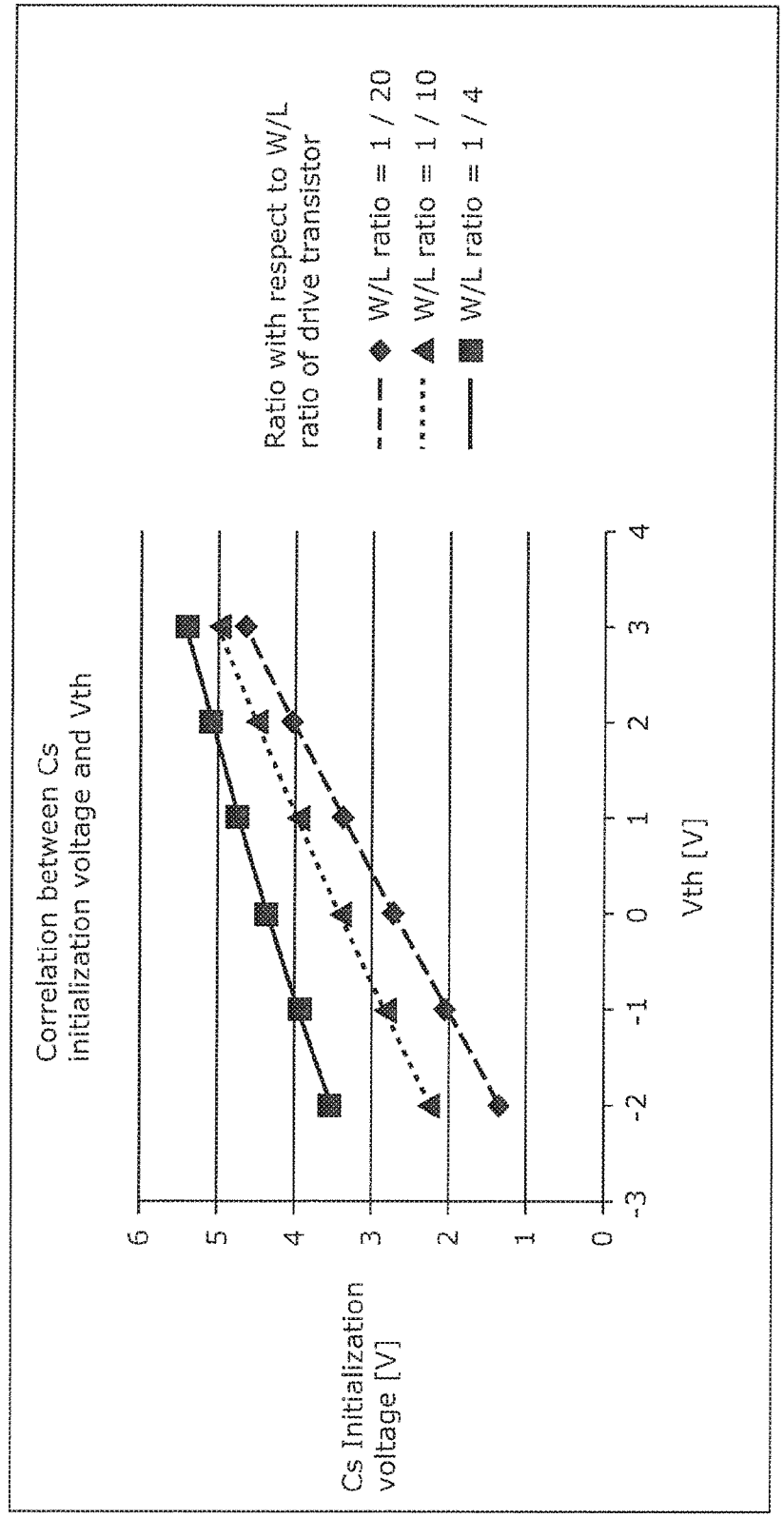
FIG. 15 is a graph showing a relationship between a Cs initialization voltage and the threshold voltage Vth, according to the embodiment.

FIG. 15 is a graph showing a relationship between a Cs initialization voltage (a voltage applied between the first electrode and the second electrode of the capacitor element Cs at the end of the initialization period) and the threshold voltage Vth. Each of the slopes of the straight lines in the graph corresponds to α=∂Vgs/∂Vth.

In FIG. 15, the voltage $Vgh_R$ of the gate electrode is 20 V when: the voltage of the power line VREF is caused to be 2 V; the voltage of the power line VINI is caused to be −4 V; and the second switch element Tr2 is brought into the On state. Moreover, FIG. 15 shows the graph on the assumption that the threshold voltage Vth of the drive transistor Trd is almost the same as the threshold voltage $Vth_R$ of the second switch element Tr2.

FIG. 15 shows the ratio between the channel width and the channel length of the second switch element Tr2 ($W_R/L_R$) with respect to the ratio between the channel width and the channel length of the drive transistor Trd ($W_D/L_D$). To be more specific, when $(W_R/L_R)/(W_D/L_D)$ is 1/20, α=∂Vgs/∂Vth=0.67. Moreover, when $(W_R/L_R)/(W_D/L_D)$ is 1/10, α=∂Vgs/∂Vth=0.55. Furthermore, when $(W_R/L_R)/(W_D/L_D)$ is 1/4, α=∂Vgs/∂Vth=0.38.

Figure 16:
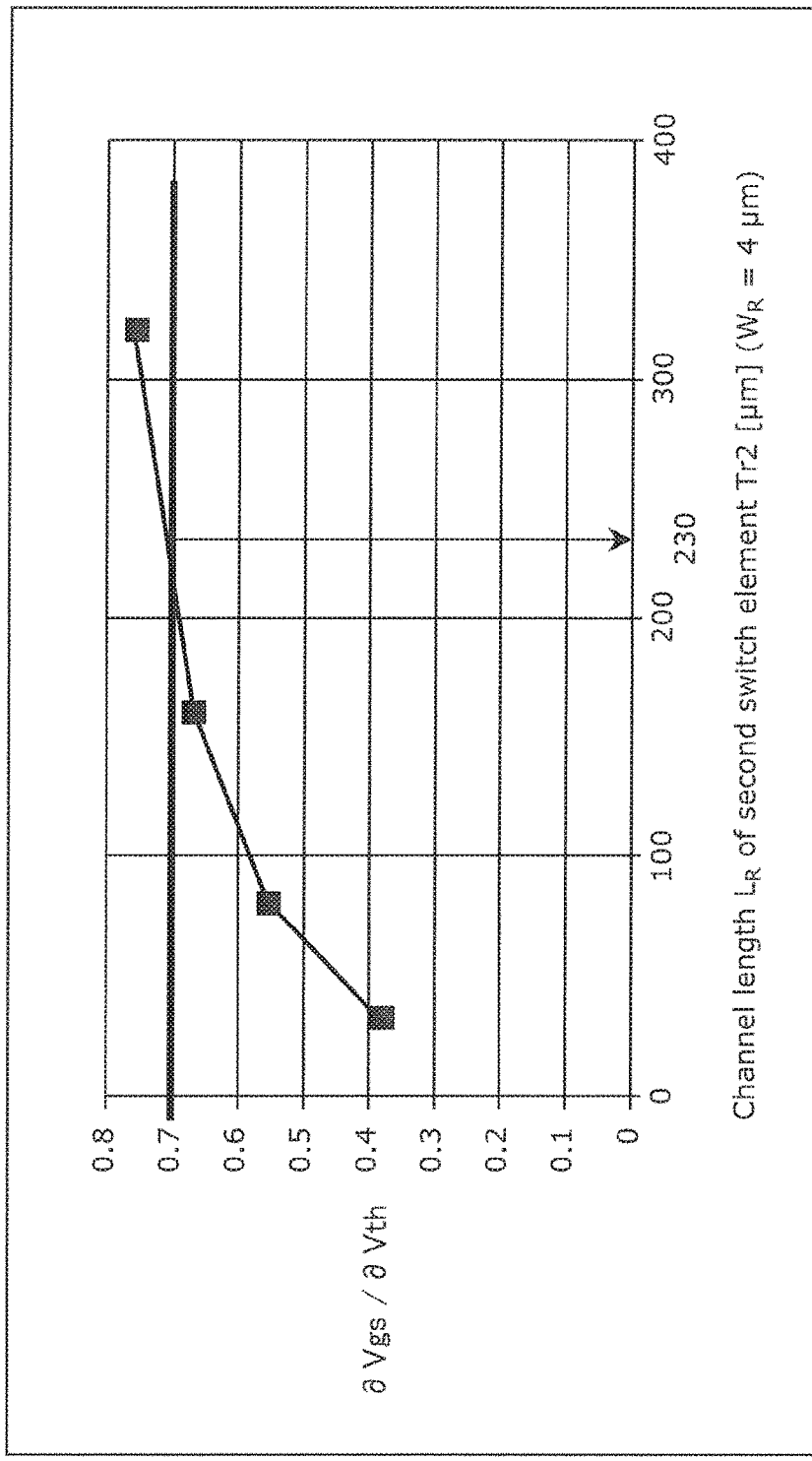
FIG. 16 is a graph showing a correlation between a value of $\partial Vgs/\partial Vth$ and a channel length $L_R$ of a second switch element, according to the embodiment.

FIG. 16 is a graph showing a correlation between the value of ∂Vgs/∂Vth and the channel length $L_R$ of the second switch element Tr2. As shown in FIG. 16, when the value of ∂Vgs/∂Vth is larger, the accuracy of threshold voltage compensation is higher and the variation in the time required for Vth detection is smaller. However, when the value of ∂Vgs/∂Vth is larger, the channel length $L_R$ of the second switch element Tr2 is longer.

Here, assume that the 40-inch 4K2K panel is used. In this case, the size of one pixel is about 230 µm, for example. Thus, it is preferable for the channel length $L_R$ of the second switch element Tr2 to be 230 µm or less. In FIG. 16, when the value of ∂Vgs/∂Vth is 0.7 or less, the channel length of the second switch element Tr2 is 230 µm or less. On this account, to design a fine panel having the channel length $L_R$ of 230 µm or less, it is preferable that ∂Vgs/∂Vth≤0.7. With this, the layout size of the resistance unit does not exceed the layout size of one pixel (display pixel PX) and thus the impossibility of the layout can be prevented.

Moreover, the voltage of the source electrode of the drive transistor Trd at the start of threshold voltage compensation is expressed as VTFT−(VINI+Ron×Id) as described above. Here, when the second switch element Tr2 satisfies ∂Vgs/∂Vth>0.7, the On resistance Ron is extremely large. In this case, the voltage of the source electrode becomes so large that it may be possible that the gate-source voltage having an amplitude sufficient for threshold voltage compensation cannot be provided. Also in view of this, it is preferable that ∂Vgs/∂Vth≤0.7.

It should be noted that when a different constraint is required for the channel length $L_R$, the upper limit of ∂Vgs/∂Vth may be set at a value other than 0.7. It is preferable to make the setting according to constrains of the organic EL panel 11 to be designed.

[2. Operation of Organic EL Display]

Figure 17:
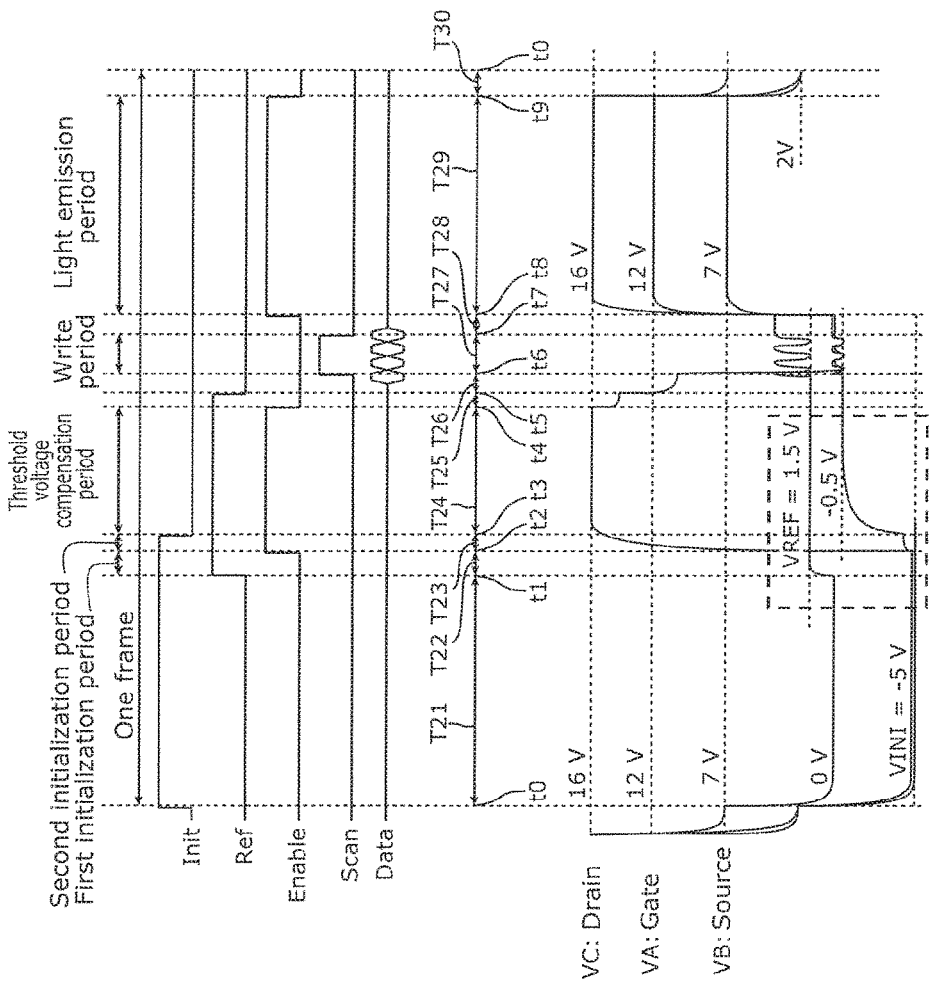
FIG. 17 is a graph showing signal waveforms of the organic EL display according to the embodiment.

FIG. 17 is a graph showing signal waveforms of the organic EL display 10 according to the present embodiment.

For the organic EL display 10 according to the present embodiment, the two initialization periods, which are the first and second initialization periods, are provided. In the organic EL display 11 according to the present embodiment, after the lapse of the initialization periods, the threshold voltage compensation period, a write period, and a light emission period are provided in this order.

Here, assume that all the switch elements are in the Off state until a time t0.

Moreover, the second switch element Tr2 is caused to operate as the switch in a first initialization period T22 and as the resistance unit in a second initialization period T23. The H-level voltages of the signal line Scan, the signal line Ref, and the signal line Enable are set according to the characteristics of the switch elements in a manner that each of the first switch element Tr1, the third switch element Tr3, and the fourth switch element Tr4 can operate with resistance that is sufficiently low so that the present switch element can be regarded as the switch.

(Period T21: First Period)

A period from the time t0 to a time t1 shown in FIG. 17 is provided for stabilizing the voltage of the node N2.

To be more specific, at the start of the period T21, the control unit 20 executes a first step of setting the second switch element Tr2 in the conducting state and the other switch elements in the non-conducting state. With this, the voltage of the node N2 is stabilized at the voltage of the power line VINI in the period T21.

The scanning-line drive circuit 13 maintains the first switch element Tr1, the third switch element Tr3, and the fourth switch element Tr4 in the Off state by maintaining the voltages of the signal line Scan, the signal line Ref, and the signal line Enable at the L level.

Moreover, at the start of the period T21, the scanning-line drive circuit 13 changes the state of the second switch element Tr2 from the Off state to the On state by changing the level of the voltage of the signal line Init from the L level to the H level.

With the period T21 provided in this way, the voltage of the node N2 can be stabilized at the voltage of the power line VINI in a short period of time. Moreover, the capacitor element Cs causes the voltage of the node N1 to be reduced (to a voltage expressed as Voltage of Power Line VINI+Gate-Source Voltage Vgs of Drive Transistor Trd during Light Emission in Previous Frame).

The reason why the period T21 is provided is as follows. When the size of the organic EL panel 11 or the size of one pixel (display pixel PX) is large, this means that a capacity Coled of the organic EL element OEL is large and thus a wiring time constant of the power line VINI is large. On this account, when the size of the organic EL panel 11 or the size of one pixel is larger, a time it takes for the voltage of the node N2 to reach the voltage of the power line VINI is longer. Thus, with the period T21 in which the second switch element Tr2 is set in the conducting state and the voltage of the power line VINI is applied to the node N2, the voltage of the node N2 can be set at the voltage of the power line VINI in a shorter period of time. In other words, with the period T21 provided in this way, the voltage of the power line VINI can be written into wiring capacitances of the organic EL element OEL and the power line VINI in a shorter period of time.

Here, it similarly takes a time for the voltage of the power line VREF to be applied to the node N1. However, the destinations of charge and discharge of the voltage of the power line VREF are wiring capacitances of the capacitor element Cs and the power line VREF. Here, the wiring time constant of the power line VREF is almost the same as that of the power line VINI. However, the capacity of the organic EL element OEL is larger than the capacity of the capacitor element Cs, and a capacity ratio of the organic EL element OEL to the capacitor element Cs (Organic EL Element OEL/Capacitor Element Cs) is from 1.3 to 9. More specifically, a time it takes to charge the organic EL element OEL is longer than a time it takes to charge the capacitor element Cs. In other words, a time it takes for the voltage of the node N2 to reach the voltage of the power line VINI is longer than a time it takes for the voltage of the node N1 to reach the voltage of the power line VREF. In further other words, a time it takes to write the voltage of the power line VINI into the organic EL element OEL is longer than a time it takes to write the voltage of the VREF into the capacitor element Cs.

Moreover, the period T21 provided in this way has an advantage that the load of the power line VREF can he reduced since the voltage of the node N2 is set at the voltage of the power line VINI. To be more specific, with the period T21, the voltage of the node N1 can be set at a low voltage and the power line VREF only has to supply a current (voltage) for charging the display pixel PX. In other words, the period T21 provided in this way has an advantage that the load of the power line VREF is reduced because the voltage of the power line VREF is not used for charging the organic EL element OEL.

(Period T22: First Initialization Period)

A period T22 from the time t1 to a time t2 shown in FIG. 17 is the first initialization period in which a voltage required to pass a drain current for threshold voltage compensation to be performed on the drive transistor Trd is applied between the gate electrode and the source electrode of the drive transistor Trd.

To be more specific, in the first initialization period, the control unit 20 executes a first initializing step. By this step, while the application of the drive voltage for driving the organic EL element OEL to the drain electrode of the drive transistor Trd is stopped, an initialization voltage is applied to the second EL of the capacitor element Cs by applying a reference voltage to the first electrode of the capacitor element Cs and setting the second switch element Tr2 in the conducting state.

Figure 18:
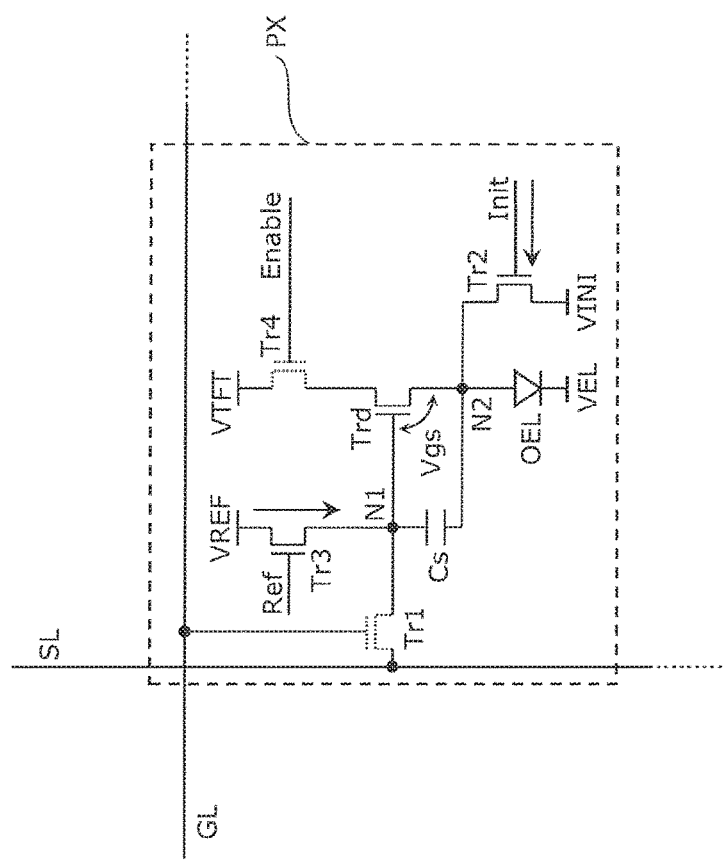
FIG. 18 is a circuit diagram showing a state of a display pixel in a first initialization period according to the embodiment.

FIG. 18 is a circuit diagram showing the state of the display pixel PX in the first initialization period.

More specifically, the second switch element Tr2 and the third switch element Tr3 are set in the conducing state and the first switch element Tr1 and the fourth switch element Tr4 are set in the non-conducting state in the period T22, as shown in FIG. 17 and FIG. 18.

The scanning-line drive circuit 13 maintains the first switch element Tr1 and the fourth switch element Tr4 in the Off state by maintaining the voltages of the signal line Scan and the signal line Enable at the L level. Moreover, the scanning-line drive circuit 13 maintains the second switch element Tr2 in the On state by maintaining the voltage of the signal line Init at the H level.

Furthermore, at the start of the period T22, the scanning-line drive circuit 13 changes the state of the third switch element Tr3 from the Off state to the On state by changing the level of the voltage of the signal line Ref from the L level to the H level. Here, the current passing through the second switch element Tr2 is only required to charge and discharge the capacitor element Cs, and is almost zero when charge and discharge of the capacitor element Cs converge. On this account, an On resistance of the second switch element Tr2 is almost negligible. Thus, the second switch element Tr2 operates as the switch.

With this, the voltage of the node N1 is set at the voltage of the power line VREF. Here, since the second switch element Tr2 is in the conducting state, the voltage of the node N2 is set at the voltage of the power line VINI. To be more specific, the voltage of the power line VREF is applied to the gate electrode of the drive transistor Trd, and the voltage of the power line VINI is applied to the source electrode of the drive transistor Trd.

The first initialization period is set to have a length of time in which, for example, charge and discharge of the node N1 can be sufficiently performed.

Here, a 40-inch 4K2K display is used as an example to describe the setting of the first initialization period. It should be noted that the present setting of the first initialization period is merely an example. Thus, when a display of a similar type is different in any one of the conditions described below, this means that the first initialization period is different as well.

The 40-inch 4K2K display has the following settings: VthMargin=2.5 V; VthMax=2 V; VthMin=0 V; Vgs_Peak=6.5 V; Id_Peak=4.5 µA; Cs=0.5 pF; Coled=2.5 pF; Ron_Sw=0.6 MΩ; and Ron_Drv=1 MΩ. Here, Cs represents a capacity value of the capacitor element of the display pixel PX, and Coled represents the capacity of the organic electrode element OEL. Moreover, Ron_Sw represents the On resistance of the second switch element Tr2, and Ron_Drv represents the On resistance of the drive transistor Trd. For the sake of simplicity, small parasitic capacitances attached to intersections of wiring lines in the transistor and the display pixel are omitted in the following description.

The first initialization period is calculated by adding a charge-discharge time of the node N1 in the display pixel PX and a time required to charge and discharge a CR load of the power line VREF.

(1) The charge-discharge time of the node N1 in the display pixel PX is described. Here, assume that a time constant which is a CR time constant of the display pixel PX when the node N1 is initialized and which is required to charge and discharge the node N1 to 99.9% is 6.9 tau. In this case, the charge-discharge time in the display pixel PX is expressed as CR Coefficient×Cs×Ron_Sw=6.9×0.5 pF×0.6 MΩ=2.1 µsec.

(2) The time required to charge and discharge the CR load of the power line VREF is described. Here, assume that the resistance of the power line VREF is 3 KΩ (sheet resistance 0.1 Ω/square) and that a wiring load is 500 pF. In this case, the CR time constant of the power line VREF is expressed as 3 KΩ×500 pF=1.5 µsec. Thus, the time required to charge and discharge the CR load of the power line VREF is expressed as 1.5 µsec×6.9 tau=10.4 µsec.

From the description thus far, the first initialization period is expressed as 2.1 µsec+10.4 µsec=12.5 µsec.

As described above, in the initialization period, the gate-source voltage Vgs of the drive transistor Trd is set at a voltage that can provide an initial drain current required to perform a threshold correction operation. Thus, a voltage difference between the voltage of the power line VREF and the voltage of the power line VINI is set at a voltage larger than the maximum threshold voltage VthMax of the drive transistor Trd. More specifically, the voltage difference is set at a value calculated by adding the voltage margin VthMargin required for threshold voltage compensation to the maximum threshold voltage VthMax of the drive transistor Trd. Furthermore, the voltage of the power line VREF and the voltage of the power line VINI are set in a manner that no current passes through the organic EL element OEL. To be more specific, these respective voltages of the power lines are set to satisfy the following: Voltage of Power Line VINI<Voltage of Power Line VEL+Forward Current Threshold Voltage of Organic EL Element OEL; and Voltage of Power Line VREF<Voltage of Power Line VEL+Forward Current Threshold Voltage of Organic EL Element OEL+ Minimum Threshold Voltage VthMin of Drive Transistor Trd.

(Period T23: Second Initialization Period)

A period T23 from the time t2 to a time t3 shown in FIG. 17 is the second initialization period. In the second initialization period, the voltage of the source electrode of the drive transistor Trd is corrected to reduce the variation in the time required to perform threshold voltage compensation.

To be more specific, in the second initialization period, the control unit 20 executes a second initializing step after the first initializing step. By the second initializing step, while the application of the reference voltage to the first electrode of the capacitor element Cs is maintained and the second switch element Tr2 is maintained in the conducting state, the application of the drive voltage to the drain electrode of the drive transistor Trd is started.

Figure 19:
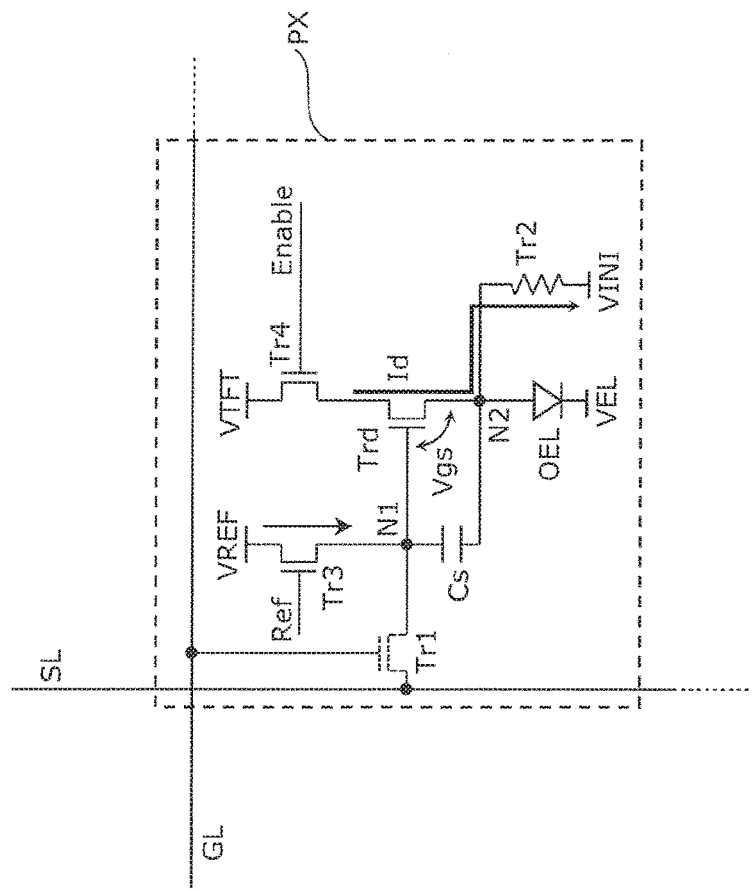
FIG. 19 is a circuit diagram showing the state of the display pixel in a second initialization period according to the embodiment.

FIG. 19 is a circuit diagram showing the state of the display pixel PX in the second initialization period.

More specifically, the second switch element Tr2, the third switch element Tr3, and the fourth switch element Tr4 are set in the conducing state and the first switch element Tr1 is set in the non-conducting state in the period T23, as shown in FIG. 17 and FIG. 19.

The scanning-line drive circuit 13 maintains the first switch element Tr1 in the Off state by maintaining the voltage of the signal line Scan at the L level. Moreover, the scanning-line drive circuit 13 maintains the second switch element Tr2 and the third switch element Tr3 in the On state by maintaining the voltages of the signal line Init and the signal line Ref at the H level.

Furthermore, at the start of the period T23, the scanning-line drive circuit 13 changes the state of the fourth switch element Tr4 from the Off state to the On state by changing the level of the voltage of the signal line Enable from the L level to the H level.

At this time, the flow-through current flows from the power line VTFT to the power line VINI via the fourth switch element Tr4, the drive transistor Trd, and the second switch element Tr2, as shown in FIG. 19. While the second switch element Tr2 is in the conducting state, the flow-through current keeps flowing. Thus, the voltage applied to the source electrode of the drive transistor Trd is influenced by the On resistance of the second switch element Tr2. In other words, the second switch element Tr2 operates as the resistance unit. Hence, the voltage of the source electrode of the drive transistor Trd at the end of the second initialization period is expressed as VTFT−(VINI+Ron×Id).

As described above, the flow-through current Id is smaller when the threshold voltage Vth of the drive transistor Trd is larger, and is larger when the threshold voltage Vth is smaller. To be more specific, when the threshold voltage Vth is larger, the value expressed as Ron×Id (the amount of voltage drop in the resistance unit) is smaller. Then, the voltage of the source electrode of the drive transistor Trd is smaller at the end of the initialization period and subsequently at the start of the threshold voltage compensation period.

Figure 20:
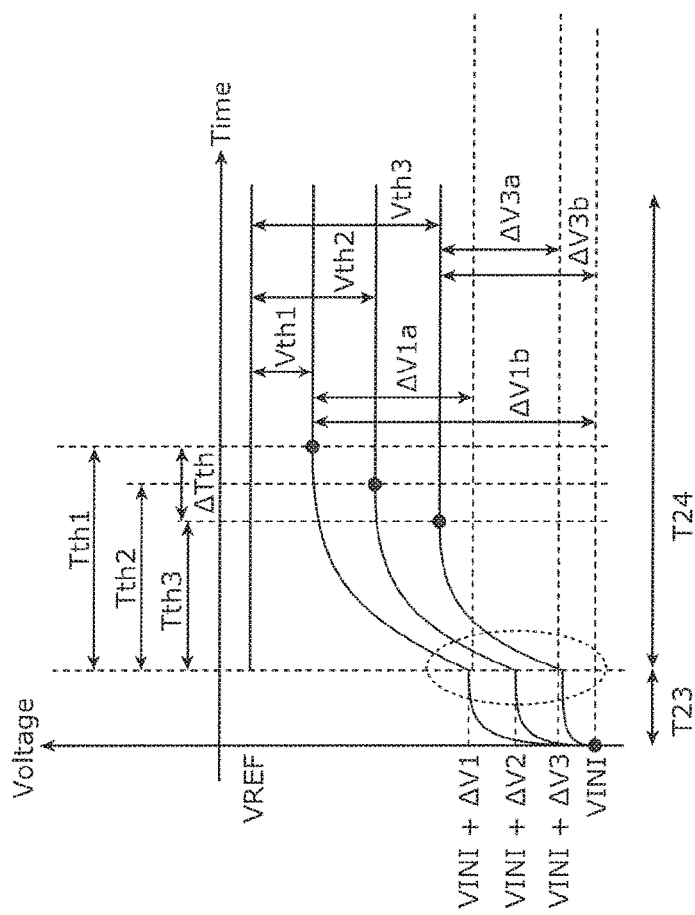
FIG. 20 is a diagram showing variations in voltage of the source electrode in the drive transistor in the second initialization period and the threshold voltage compensation period, according to the embodiment.

FIG. 20 is a graph showing variations in voltage of the source electrode in the drive transistor in the second initialization period and the threshold voltage compensation period. The graph shown in FIG. 20 corresponds to the graph surrounded by a dashed line in FIG. 17.

As shown in FIG. 20, when the value of the threshold voltage Vth is smaller (Vth1<Vth2<Vth3), the amount of increase in the voltage of the source electrode of the drive transistor Trd in the second initialization period T23 ($\Delta$V1 to $\Delta$V3) is larger ($\Delta$V1>$\Delta$V2>$\Delta$V3).

It is only required that the second initialization period has a length that enables the node N2 to charge and discharge corresponding to a certain amount of voltage. Note that the length of time for the node N2 to be able to charge and discharge corresponding to the certain amount of voltage differs depending on the value of the threshold voltage Vth.

For example, assume that the voltage between the gate electrode and the source electrode of the drive transistor Trd before the start of the threshold voltage compensation period is expressed as Vgs=VREF−VINI=6.5 V. When the threshold voltage Vth is expressed as VthMin=0 V, it is only required that the voltage Vgs of the drive transistor Trd at the start of the threshold voltage compensation period is expressed as VthMin+VthMargin=2.5 V. In this case, it is only required that the node N2 can discharge the charge quantity corresponding to the expression 6.5−2.5=4.0 V. Note that the electrical charge is gradually discharged during the threshold voltage compensation period in a manner that Vgs of the drive transistor Trd is reduced from 2.5 V to 0 V.

On the other hand, when the threshold voltage Vth is expressed as VthMax=2 V, it is only required that the voltage Vgs of the drive transistor Trd at the start of the threshold voltage compensation period is expressed as VthMax+VthMargin=4.5 V. In this case, it is only required that the node N2 can discharge the charge quantity corresponding to the expression 6.5−4.5=2.0 V. Note that the electrical charge is gradually discharged during the threshold voltage compensation period in a manner that Vgs of the drive transistor Trd is reduced from 4.5 V to 2 V. The amount of electrical discharge of the drive transistor Trd during the threshold voltage compensation period in this case is almost the same as in the case where the threshold voltage Vth is VthMin. To be more specific, between the cases where the threshold voltage Vth is VthMin and where the threshold voltage Vth is VthMax, the respective lengths of time it takes for the operation associated with threshold voltage compensation to converge are almost the same.

It is only required that the second initialization period has a length of time that enables the node N2 to charge and discharge corresponding to the certain amount of voltage in a worst case (where the threshold voltage Vth is VthMin). Moreover, the length of time of the second initialization period is calculated by adding a charge-discharge time of the node N2 in the display pixel PX and a time required to charge and discharge a CR load of the power line VINI. Thus, a CR time constant of the node N2 is a length of time to charge and discharge corresponding to an expression 4 V/6.5 V=62% (=0.96 tau).

(1) The charge-discharge time of the node N2 in the display pixel PX is described. The charge-discharge time in the display pixel PX is expressed as CR Time Constant× (Cs+Coled)×Ron_Drv=0.96×(0.5 pF+2.5 pF)×1 MΩ=2.88 μsec. Note that the values of Cs, Coled, and Ron_Drv are the same as those in the first initialization period.

(2) The time required to charge and discharge the CR load of the power line VINI is described. Here, assume that the CR time constant of the power line VINI is almost the same as the CR time constant of the power line VREF. In this case, the time required to charge and discharge the CR load of the power line VINI is expressed as 1.5 μsec×0.96 tau=1.44 μsec.

From the description thus far, the second initialization period is expressed as 2.88 μsec+1.44 μsec=4.32 μsec. As described above, the first initialization period is 12.5 μsec. Thus, the second initialization period is shorter than the first initialization period.

(Period T24: Threshold Voltage Compensation Period)

A period T24 from the time t3 to a time t4 shown in FIG. 17 is the threshold voltage compensation period in which the threshold voltage of the drive transistor Trd is compensated for.

In the threshold voltage compensation period, the control unit 20 executes, after the execution of the second initializing step, a step of setting the second switch element in the non-conducting state while the application of the reference voltage to the first electrode of the capacitor element Cs is maintained and the application of the drive voltage to the drain electrode of the drive transistor Trd is maintained.

To be more specific, the third switch element Tr3 and the fourth switch element Tr4 are set in the conducting state and the first switch element Tr1 and second switch element Tr2 are set in the non-conducting state in the period T24, as shown in FIG. 17.

The scanning-line drive circuit 13 maintains the first switch element Tr1 in the Off state by maintaining the voltage of the signal line Scan at the L level. Moreover, the scanning-line drive circuit 13 maintains the third switch element Tr3 and the fourth switch element Tr4 in the On state by maintaining the voltages of the signal line Ref and the signal line Enable at the H level.

Moreover, at the start of the period T24, the scanning-line drive circuit 13 changes the state of the second switch element Tr2 from the On state to the Off state by changing the level of the voltage of the signal line Init from the H level to the L level.

In this way, the voltage of the power line VREF is inputted to the gate electrode of the drive transistor Trd, and the second switch element Tr2 is set in the non-conducting state (the Off state) while the fourth switch element Tr4 is set in the conducting state (the On state). With this, threshold voltage compensation for the drive transistor Trd can be started.

For example, when the threshold voltage is Vth1, the voltage of the source electrode of the drive transistor Trd at the end of the second initialization period T23 is expressed as Power line VREF−Vth1, as shown in FIG. 20. Thus, when only the first initialization period is provided, the voltage of the source electrode of the drive transistor Trd needs to increase by $\Delta$V1b in threshold voltage compensation. However, when the second initialization period is also provided, the voltage of the source electrode of the drive transistor Trd needs to increase only by $\Delta$V1a that is smaller than $\Delta$V1b. In other words, the increase in the voltage during the threshold voltage compensation period can be suppressed corresponding to the increase in the voltage during the second initialization period. When the threshold voltage is Vth1, the increase in the voltage during threshold voltage compensation is smaller by $\Delta$V1 in the present embodiment as compared to the comparative example.

When the threshold voltage is Vth2 or Vth3, the increase in the voltage by threshold voltage compensation is also reduced by $\Delta$V2 or $\Delta$V3.

Moreover, as described above, when the value of the threshold voltage Vth is smaller (Vth1<Vth2<Vth3), the amount of increase in the voltage of the source electrode of the drive transistor Trd in the second initialization period T23 ($\Delta$V1 to $\Delta$V3) is larger ($\Delta$V1>$\Delta$V2>$\Delta$V3) according to the present embodiment. By comparison between FIG. 3 and FIG. 20, it can be seen that the variation $\Delta$Tth in the length of time for threshold voltage compensation (Tth1−

Tth3=ΔTth) is shorter in the present embodiment than in the comparative example. More specifically, it can be seen from FIG. 3 and FIG. 20 that the variation in the length of time for threshold voltage compensation is reduced.

(Period T25: Third Period)

A period T25 from the time t4 to a time t5 shown in FIG. 17 is a period in which the threshold voltage compensation operation is ended.

To be more specific, the first switch element Tr1, the second switch element Tr2, and the third switch element Tr3 are set in the conducting state and the fourth switch element Tr4 is set in the non-conducting state in the period T25, as shown in FIG. 17. The control unit 20 executes a third step of changing the state of the fourth switch element Tr4 from the conducting state to the non-conducting state at the start of the period T25.

The scanning-line drive circuit 13 maintains the first switch element Tr1 and the second switch element Tr2 in the Off state by maintaining the voltages of the signal line Scan and the signal line Init at the L level. Moreover, the scanning-line drive circuit 13 maintains the third switch element Tr3 in the On state by maintaining the voltage of the signal line Ref at the H level.

Furthermore, at the start of the period T25, the scanning-line drive circuit 13 changes the state of the fourth switch element Tr4 from the On state to the Off state by changing the level of the voltage of the signal line Enable from the H level to the L level.

In this way, the period T25 is provided in which the fourth switch element Tr4 is set into the non-conducting state through an operation by the signal line Enable after the threshold voltage compensation period. With this, a current supply from the power line VEL, which is connected to the anode electrode of the organic EL element OEL, to the node N2 can be stopped via the drive transistor Trd. Then, after threshold voltage compensation is reliably ended, a next operation can be performed.

(Period T26: Fourth Period)

In a period T26 from the time t5 to a time t6 shown in FIG. 17, by setting the third switch element Tr3 in the non-conducting state (the Off state), concurrent applications of the voltage of the data signal supplied via the signal line Data and the voltage of the power line VREF to the node N1 are prevented.

To be more specific, the first switch element Tr1, the second switch element Tr2, the third switch element Tr3, and the fourth switch element Tr4 are set in the non-conducting state in the period T26, as shown in FIG. 17. The control unit 20 executes a fourth step of changing the state of the third switch element Tr3 from the conducing state to the non-conducting state at the start of the period T26.

The scanning-line drive circuit 13 maintains the first switch element Tr1, the second switch element Tr2, and the fourth switch element Tr4 in the Off state by maintaining the voltages of the signal line Scan, the signal line Init, and the signal line Enable at the L level. Moreover, at the start of the period T26, the scanning-line drive circuit 13 changes the state of the third switch element Tr3 from the On state to the Off state by changing the level of the voltage of the signal line Ref from the H level to the L level.

In this way, the period T26 is provided in which the third switch element Tr3 is further set into the non-conducting state through an operation by the signal line Ref and the first switch element Tr1 and the third switch element Tr3 are set in the non-conducting state (the Off state) simultaneously. With this, the concurrent applications of the voltage of the data signal supplied from the first switch element Tr1 via the signal line Data and the voltage of the power line VREF to the node N1 can be prevented.

It should be noted that the period T25 and the period T26 may be combined into one period by setting the third switch element Tr3 and the fourth switch element Tr4 in the non-conducting state (the Off state) simultaneously.

The division of the period into the period T25 and the period T26 has advantages as follows. When the period T25 and the period T26 are provided separately, the following are the advantages: that a period in which the voltage of the node N1 that is the gate voltage of the drive transistor Trd is inconstant can be reduced; that a voltage variation that can be possibly caused in the inconstant-voltage period can be suppressed; and that display based on the video signal can be executed more accurately.

Moreover, gradation display is achieved according to a voltage difference between the voltage of the node N1 at the end of the period T26 (at the time t6) and the voltage of the node N1 at the completion of writing of the voltage of the data signal received via the signal line Data (writing of the voltage corresponding to the video signal) (at the time t7). On this account, it is preferable for the variation in the voltage of the node N1 during the period T26 to be smaller. Ideally, since the voltage of the power line VREF is applied to the node N1 in the period T24 and the voltage of the node N1 is stored in the period T25, the display luminance of the organic EL element OEL is determined based on the voltage difference (expressed as Voltage of Data Signal−Voltage of Power Line VREF).

Here, to accurately reflect the voltage expressed as Voltage of Data Signal−Voltage of Power Line VREF, the period T26 should be as short as possible.

Moreover, the fourth switch element Tr4 connected to the signal line Enable is connected to the drain side of the drive transistor Trd, as shown in FIG. 4. When the fourth switch element Tr4 is formed using an n-type transistor, the On resistance of the fourth switch element Tr4 is likely to become high and a voltage drop due to the On resistance influences the power consumption of the organic EL panel 11. For this reason, the On resistance should be set as low as possible when the fourth switch element Tr4 is formed. Generally known examples of the method of reducing the On resistance of the fourth switch element Tr4 include: a method of increasing the channel size of the fourth switch element Tr4; and a method of setting the H-level voltage of the signal line Enable (an On-state control voltage) high. However, either method causes a fall time of the signal line Enable to be longer.

In view of this, the period T25 in which the signal line Enable is caused to fall before the signal line Ref is provided according to the present embodiment. With this, the period in which the voltage of the node N1 is inconstant can be reduced, or more specifically, the fall time can be reduced.

(Period T27: Write Period)

A period T27 from the time t6 to a time t7 shown in FIG. 17 is the write period. In the write period, the voltage of the data signal that has a voltage value corresponding to a gradation value included in the video signal received from the signal line Data is written into the capacitor element Cs via the first switch element Tr1.

To be more specific, the first switch element Tr1 is set in the conducting state and the second switch element Tr2, the third switch element Tr3, and the fourth switch element Tr4 are set in the non-conducting state in the period T27, as shown in FIG. 17.

The scanning-line drive circuit 13 maintains the second switch element Tr2, the third switch element Tr3, and the fourth switch element Tr4 in the Off state by maintaining the voltages of the signal line Init, the signal line Ref, and the signal line Enable at the L level. Moreover, at the start of the period T27, the scanning-line drive circuit 13 changes the state of the first switch element Tr1 from the Off state to the On state by changing the level of the voltage of the signal line Scan from the L level to the H level.

With this, the capacitor element Cs stores (holds), in addition to the threshold voltage Vth of the drive transistor Trd stored in the threshold voltage compensation period, the value obtained by multiplying the voltage difference between the voltage of the data signal and the voltage of the power line VREF by the following: (Capacity of Organic EL Element OEL)/(Capacity of Organic EL Element OEL+Capacity of Capacitor Element Cs). Here, since the fourth switch element Tr4 is in the non-conducting state, the drive transistor Trd passes no drain current. On this account, the voltage of the node N2 does not vary significantly during the period T27.

With an increase in the screen size (with an increase in size of the organic EL panel 11) and an increase in the number of display pixels PX, the period in which the data signal is written into the display pixels PX (the horizontal scanning period) is reduced. With the increase in the screen size, the wiring time constant of the signal line Scan increases as well. With the reduction in the horizontal scanning period and the increase in the wiring time constant of the signal line Scan, it is more difficult to write a voltage corresponding to a desired gradation value into the display pixel PX, as compared to a conventional organic EL panel 11.

In view of this, the period in which the first switch element Tr1 is set in the conducting state (the period T27) is increased in a manner that the video signal (the voltage of the data signal) can be taken in within a limited period of time as shown in FIG. 17, according to the present embodiment. Moreover, in the present embodiment, even when the signal line Scan has a waveform distortion, the rise of the signal line Scan is completed before the voltage of the data signal is inputted into the signal line Data and the first switch element Tr1 is then set in the conducting state (the On state). This prevents a significant variation in the voltage of the node N2 during the period T27.

Thus, writing can be reliably performed even when the organic EL panel 11 has a large screen size and a large number of pixels and thereby has a large load (the wiring time constant) for the signal line Scan and a long rise time.

It should be noted that since driving is executed as described, the wiring width of the signal line Scan can be made thinner. In this case, the size (the capacity) of the capacitor element Cs may be increased by the reduction in the wiring width, for higher display performance.

Assume that the capacitor element Cs is small. In this case, due to a series relationship among the drain-gate parasitic capacitance of the drive transistor Trd, the capacitor element Cs, and the capacity of the organic EL element OEL, the charge quantity stored in the capacitor element Cs noticeably varies with the variation in the power line VEL. This leads to a problem in the display performance. Thus, the ratio between the parasitic capacitance and the storage capacitance is important for the display performance. It is preferable for the ratio to be expressed as Storage Capacitance/Parasitic Capacitance>>1.

In this way, the voltage corresponding to the voltage of the data signal and to the threshold voltage of the drive transistor Trd is stored (held) into the capacitor element Cs in the period T27 (the write period).

(Period T28)

A period T28 from the time t7 to a time t8 shown in FIG. 17 is a period in which the first switch element Tr1 is reliably set in the non-conducting state.

To be more specific, the first switch element Tr1, the second switch element Tr2, the third switch element Tr3, and the fourth switch element Tr4 are set in the non-conducting state in the period T28, as shown in FIG. 17.

The scanning-line drive circuit 13 maintains the second switch element Tr2, the third switch element Tr3, and the fourth switch element Tr4 in the Off state by maintaining the voltages of the signal line Init, the signal line Ref, and the signal line Enable at the L level. Moreover, at the start of the period T28, the scanning-line drive circuit 13 changes the state of the first switch element Tr1 from the On state to the Off state by changing the level of the voltage of the signal line Scan from the H level to the L level.

With this, the first switch element Tr1 can be reliably set in the non-conducting state (the Off state) before the fourth switch element Tr4 is set in the conducting state (the On state) in a subsequent period T29 (the light emission period).

Assume that the period T28 is not provided and that the first switch element Tr1 and the fourth switch element Tr4 are set in the conducting state (the On state) simultaneously. In this case, while the drain current of the drive transistor Trd causes the voltage of the node N2 to increase, the voltage of the node N1 reaches the voltage of the data signal. As a result, the source-gate voltage of the drive transistor Trd is reduced. This case thus leads to a problem where light with a luminance lower than a desired luminance is emitted. To prevent this, the present embodiment provides the period T28 in which the non-conducting state of the first switch element Tr1 is ensured reliably, and subsequently provides the period T29 in which the fourth switch element Tr4 is set in the conducting state.

(Period T29: Light Emission Period)

The period T29 from the time t8 to a time t9 shown in FIG. 17 is the light emission period.

To be more specific, the fourth switch element Tr4 is set in the conducting state and the first switch element Tr1, the second switch element Tr2, and the third switch element Tr3 are set in the non-conducting state in the period T29, as shown in FIG. 17.

The scanning-line drive circuit 13 maintains the first switch element Tr1, the second switch element Tr2, and the third switch element Tr3 in the Off state by maintaining the voltages of the signal line Scan, the signal line Init, and the signal line Ref at the L level. Moreover, at the start of the period T29, the scanning-line drive circuit 13 changes the state of the fourth switch element Tr4 from the Off state to the On state by changing the level of the voltage of the signal line Enable from the L level to the H level.

When the fourth switch element Tr4 is set in the conducting state (the On state) in this way, the drive transistor Trd supplies the organic EL element OEL with the drive current corresponding to the voltage stored in the capacitor element Cs. This enables the organic EL element OEL to emit light.

(Period T30: Second Period)

A period T30 from the time t9 to the time t0 shown in FIG. 17 is a period in which all the switches are set in the non-conducting state and the voltages of the nodes N1 and N2 are set closer to the voltages to he required in the period T21.

To be more specific, the first switch element Tr1, the second switch element Tr2, the third switch element Tr3, and the fourth switch element Tr4 are set in the non-conducting state in the period T30, as shown in FIG. 17. At the start of the period T30, the control unit 20 executes a second step of setting the first switch element Tr1, the second switch element Tr2, the third switch element Tr3, and the fourth switch element Tr4 in the non-conducting state.

The scanning-line drive circuit 13 maintains the first switch element Tr1, the second switch element Tr2, and the third switch element Tr3 in the Off state by maintaining the voltages of the signal line Scan, the signal line Init, and the signal line Ref at the L level. Moreover, at the start of the period T30, the scanning-line drive circuit 13 changes the state of the fourth switch element Tr4 from the On state to the Off state by changing the level of the voltage of the signal line Enable from the H level to the L level.

With the period T30 provided between the period T29 and the period T21, the voltages of the nodes N1 and N2 can be set closer to the voltages to he required in the period T21 without charge and discharge of current by the power line.

To he more specific, in the period T30, the voltage of the node N2 converges to a voltage expressed as Voltage of Power Line VEL+Threshold Voltage of Organic EL Element GEL. Moreover, in the period T30, the voltage of the node N1 reaches a voltage expressed as Voltage of Node N2+Voltage stored in Capacitor Element Cs.

Thus, with the period T30, the voltages of the nodes N1 and N2 can be reduced by an amount expressed as Voltage of Organic EL Element OEL at Light Emission Time Threshold Voltage of Organic EL Element OEL, at the start of the period T21 (at the time t0) as compared to the end of the period T29 (at the time t9).

This reduction in voltage reduces the load of charging and discharging operations performed using the voltage of the power line VINI and the voltage of the power line VREF in the period T21.

According to the sequence described thus far, the display pixel PX performs gradation display.

It should be noted that the control unit 20 line-sequentially performs the same control on the other display pixels PX forming the organic EL panel 11.

[3. Advantageous Effect etc.]

The organic EL display 10 according to the present embodiment includes the resistance unit that is disposed on the current path from the node N2 to the power line VINI. Thus, in the period between the first initialization period and the threshold voltage compensation period, the source electrode of the drive transistor Trd, that is, the node N2, is supplied with the voltage, and the voltage of the node N2 can be adjusted in a manner that the time it takes to perform threshold voltage compensation is reduced. With this, even when the threshold voltage compensation period is reduced because of, for example, the increase in resolution of the display device, threshold voltage compensation can be performed with sufficient accuracy.

Moreover, with the placement of the resistance unit, when the threshold voltage Vth of the drive transistor Trd is smaller, the range of adjusting the voltage of the node N2 in the initialization period can be increased more (see FIG. 20). Such a configuration can suppress the variation in the time it takes to perform threshold voltage compensation, as described above. Thus, the threshold voltage compensation period can he easily set.

According to the present embodiment, a simple configuration providing the resistance unit can reduce the length of the threshold voltage compensation period and enhance the accuracy of threshold voltage compensation, without an increase in the manufacturing cost.

Although the display device has been described by way of the embodiments above, it should be obvious that the present invention is not limited to the embodiments described above. Other embodiments implemented through various changes and modifications conceived by a person of ordinary skill in the art or through a combination of the structural elements in different embodiments described above may be included in the scope in an aspect or aspects according to the present invention, unless such changes, modifications, and combination depart from the scope of the present invention.

(1) For example, although the second switch element Tr2 according to the above embodiment has a smaller W/L ratio than the other switch elements to function as the resistance unit, this is not intended to be limiting. For example, the On resistance of the second switch element Tr2 may be increased by setting the On voltage of the signal line Init (the voltage of the gate electrode when the switch element is set in the On state) lower than the On voltages of the other signal lines. In this case, the On voltage of the signal line Init may be different for each of the first initialization period and the second initialization period. Alternatively, while the second switch element Tr2 and the other switch elements have the same W/L ratio, the mobility of the second switch element Tr2 may be adjusted in the manufacturing process to be lower than the mobility of the other switch elements.

(2) Moreover, although the second switch element Tr2 is used as the resistance unit in the above embodiment, this is not intended to be limiting. The resistance unit may be provided with a resistance element different from the second switch element Tr2. The resistance unit may have a configuration in which, for example, a series circuit of a switch element and the resistance element is connected to the second switch element Tr2 in parallel.

Figure 21:
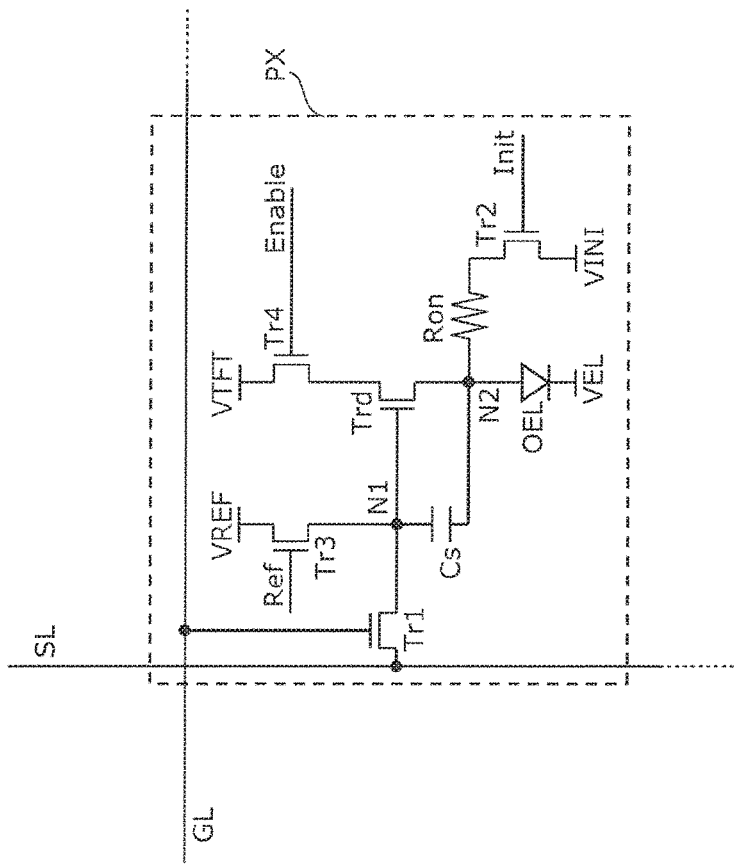
FIG. 21 is a circuit diagram showing another example of a resistance unit.

FIG. 21 is a circuit diagram showing another example of the resistance unit. In this case, since it is only required that the second switch element Tr2 functions as the switch, the On resistance may be the same as the On resistance of the other switch elements. In other words, the W/L ratio may be the same as the W/L ratio of the other switch elements. Moreover, when the switch element of the series circuit is a transistor, the control unit 20 may control the voltage of the gate electrode of the present switch element in a manner that the present switch element can operate with resistance that is sufficiently low so that the present switch element can be regarded as the switch.

Figure 22:
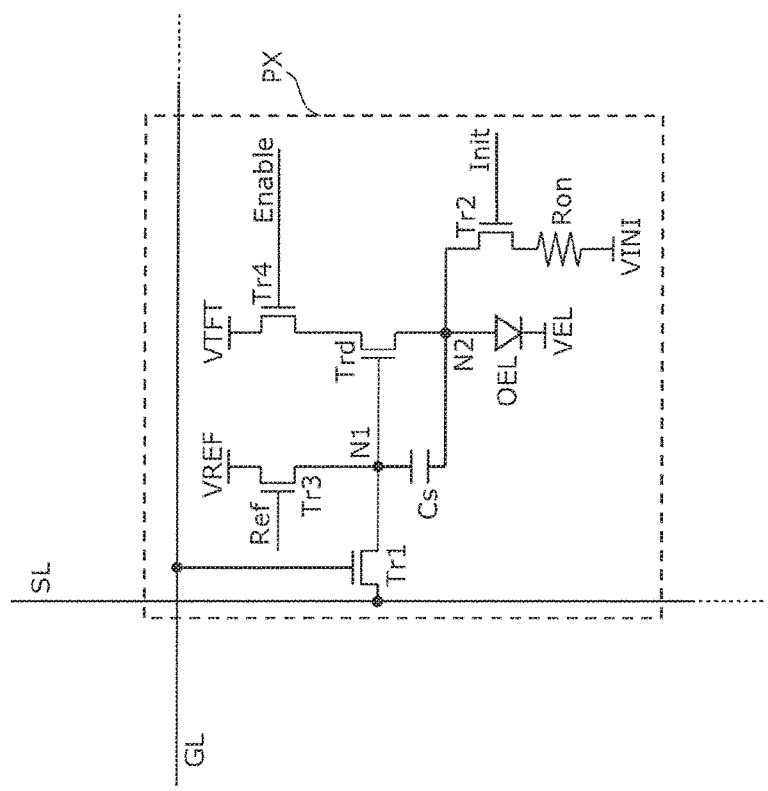
FIG. 22 is a circuit diagram showing another example of the resistance unit.
Figure 23:
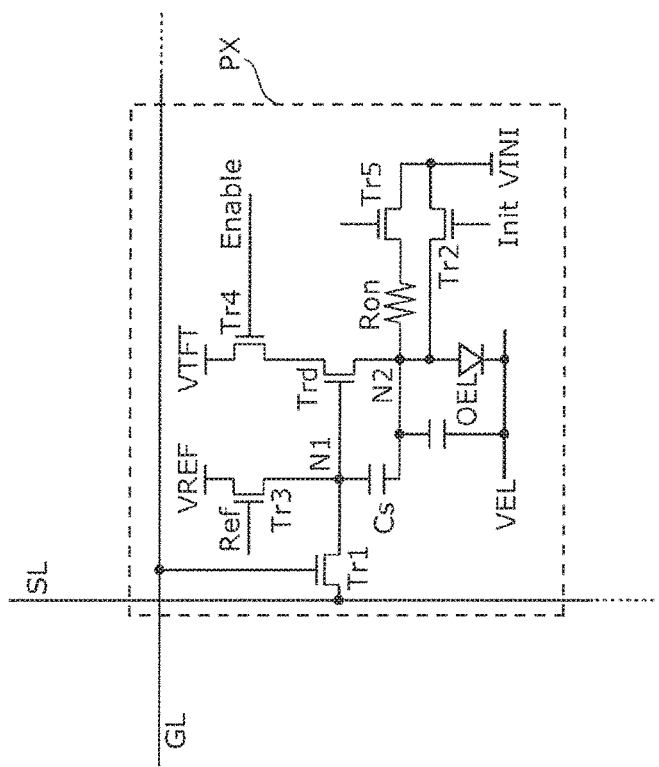
FIG. 23 is a circuit diagram showing another example of the resistance unit.

Each of FIG. 22 and FIG. 23 is a circuit diagram showing another example of the resistance unit, in each of FIG. 22 and FIG. 23, the second switch element Tr2 is directly connected to a resistance element.

(3) For example, although the display pixel PX according to the above embodiment includes the five transistors, the display pixel PX may include only three transistors (the drive transistor Trd, the first switch element Tr1, and the second switch element Tr2). In this case, the fourth switch element Tr4 that switches the state between the drain electrode of the drive transistor Trd and the power line VTFT between the conducting and non-conducting states does not exist. Thus, the first initialization period does not exist, and only the second initialization period is provided. However, this has no influence on the essential effect according to the present invention that the voltage of the source electrode of the drive transistor Trd is adjusted according to the variation ΔVth of the threshold voltage Vth of the drive transistor Trd. To obtain the advantageous effect of the present invention, it is only required that the resistance unit is disposed on the current path from the connection point of the second electrode of the capacitor element and the anode electrode of the light-emitting element to the power line. Thus, the configuration may include at least four or six transistors.

(4) Furthermore, the resistance unit may be shared among the plurality of display pixels PX.

Figure 24:
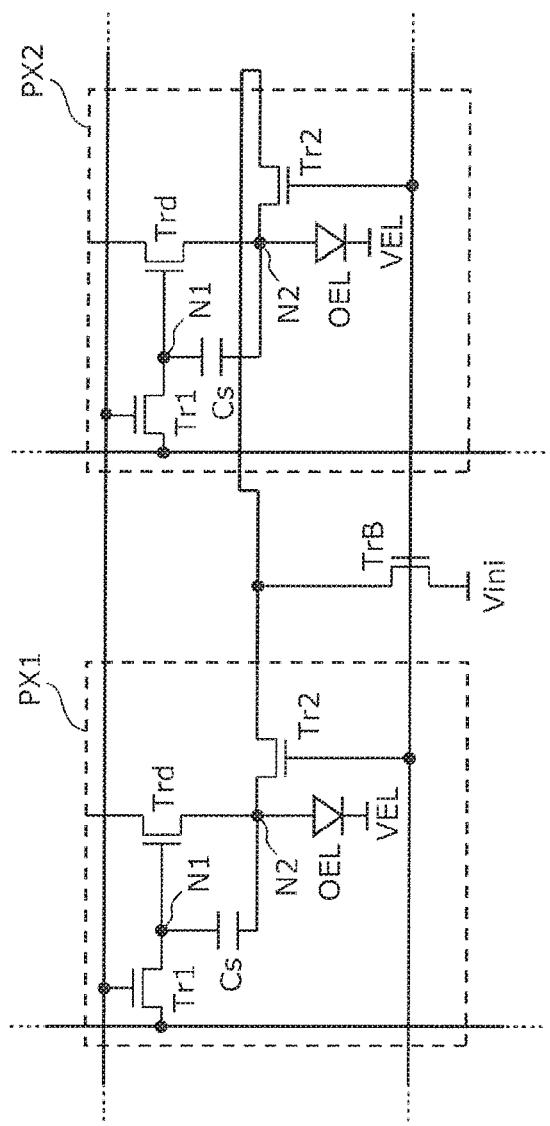
FIG. 24 is a circuit diagram showing an example of when a single resistance unit is shared by two display pixels, according to a modification.

FIG. 24 is a circuit diagram showing an example of when a single resistance unit is shared by two display pixels PX. In FIG. 24, one end of the second switch element Tr2 of a display pixel PX1 and one end of the second switch element Tr2 of a display pixel PX2 are connected to one end of a switch element TrB. According to a modification shown in FIG. 24, the second switch elements Tr2 of the display pixel PX1 and the display pixel PX2 operate as switches, and the switch element TrB operates as a resistance unit. To be more specific, the On resistance and W/L ratio of the second switch element Tr2 are set to be the same as those of the first switch element Tr1. Moreover, the W/L ratio of the switch element TrB is set to be small in a manner that the On resistance of the switch element TrB is higher than those of the first switch element Tr1 and the second switch element Tr2.

Here, the flow-through current passing through the switch element TrB during the second initialization period is about twice as much as when the resistance unit is provided for each subpixel. Thus, the voltage of the source electrode of the drive transistor Trd in the initialization period is expressed as VTFT−(VINI+Ron×2×Id). More specifically, the variation in the voltage of the source electrode of the drive transistor at the start of the threshold voltage compensation period is about twice as much as that in the above embodiment. In other words, the Ron resistance to achieve the desired value of ∂Vgs/∂Vth is about half as much as in the above embodiment, and the area of the resistance unit can he reduced by half. Thus, when the single resistance unit is shared by the two display pixels, an increase in the layout size per subpixel can be reduced to about a quarter as compared to the above embodiment.

With this, the shared use of the resistance unit among the plurality of pixels not only suppresses the increase in the layout size per subpixel, but reduces the area of the resistance unit. Hence, a higher-resolution panel can be easily designed.

(5) Furthermore, the above embodiment describes an example in which the same voltage is applied to the gate electrode of the second switch element Tr2 in both the first initialization period and the second initialization period. This is not intended to be limiting.

Figure 25:
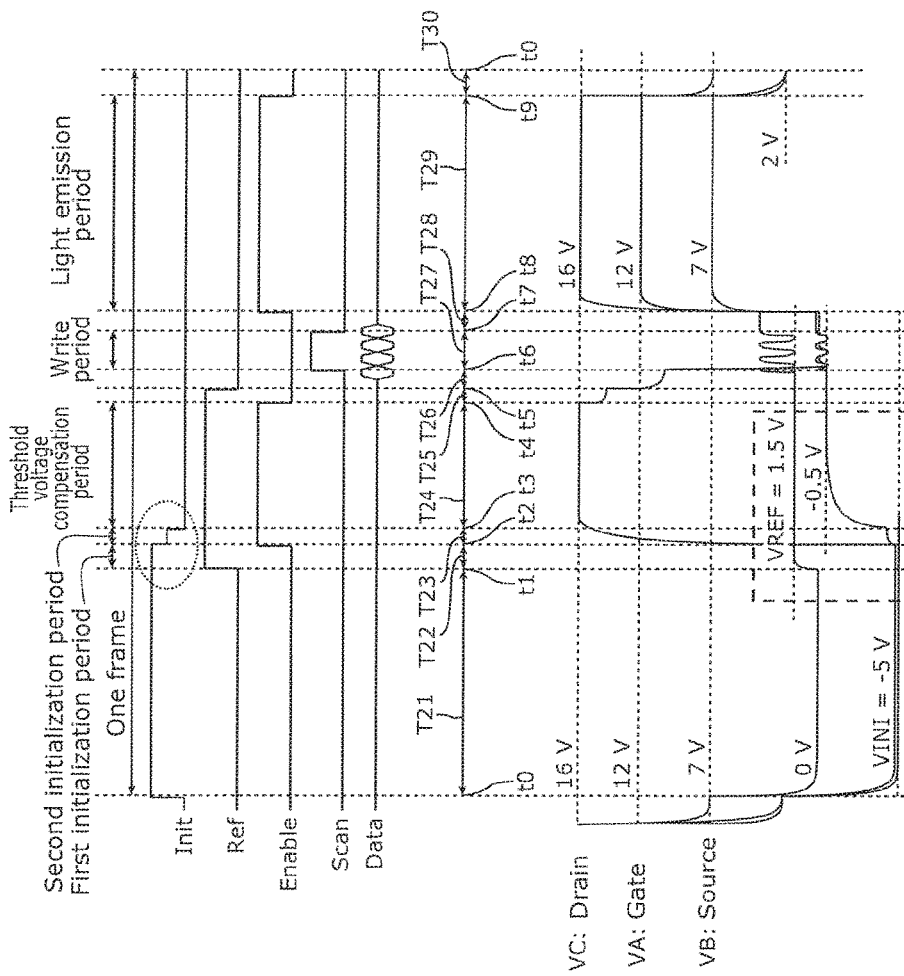
FIG. 25 is a circuit diagram showing another example of signal waveforms of an organic EL display.

FIG. 25 is a circuit diagram showing another example of signal waveforms of the organic EL display 10. In the example shown in FIG. 25, to cause the second switch element Tr2 to operate as the switch with resistance as low as possible, the gate electrode is applied with a voltage in the same level as the voltage applied to the gate electrodes of the other switch elements. Thus, the On resistance of the second switch element Tr2 is lager as compared to the On resistance in the second initialization period. On the other hand, since the second switch element Tr2 operates as a resistance in the second initialization period, the gate electrode of the second switch element Tr2 is applied with a voltage smaller than the voltage applied in the first initialization period. Thus, the On resistance of the second switch element Tr2 is smaller as compared to the On resistance in the first initialization period.

INDUSTRIAL APPLICABILITY

The present invention can be used for a display device, such as an organic EL display.

The invention claimed is:
1. A display device, comprising:
a display pixel; and
a controller configured to control driving of the display pixel,
wherein the display pixel includes
a light-emitting element;
a capacitor element that holds a voltage;
a drive transistor that has (i) a gate electrode connected to a first electrode of the capacitor element, and (ii) a source electrode connected to a second electrode of the capacitor element and to an anode electrode of the light-emitting element;
a first switch element that switches a state between a signal line for supplying a voltage corresponding to a data signal and the first electrode of the capacitor element, between conducting and non-conducting states; and
a resistance device that has a resistance, is configured to be able to switch a state between a power line for supplying an initialization voltage and the second electrode of the capacitor element between the conducting and non-conducting states, and is disposed on a current path from a connection point of the second electrode of the capacitor element and the anode electrode of the light-emitting element to the power line, and
the controller is configured to correct a threshold voltage of the drive transistor,
wherein a resistance value of the resistance device is set at a value so that an amount of variation in a voltage between the gate electrode and the source electrode of the drive transistor at a start of a period in which the threshold voltage of the drive transistor is corrected is at least 0.3 times but no more than 0.7 times as much as an amount of variation in the threshold voltage of the drive transistor.

2. A display device, comprising:
a display pixel; and
a controller configured to control driving of the display pixel,
wherein the display pixel includes
a light-emitting element;
a capacitor element that holds a voltage;
a drive transistor that has (i) a gate electrode connected to a first electrode of the capacitor element, and (ii) a source electrode connected to a second electrode of the capacitor element and to an anode electrode of the light-emitting element;
a first switch element that switches a state between a signal line for supplying a voltage corresponding to a data signal and the first electrode of the capacitor element, between conducting and non-conducting states; and
a resistance device that has a resistance, is configured to be able to switch a state between a power line for supplying an initialization voltage and the second electrode of the capacitor element between the conducting and non-conducting states, and is disposed on a current path from a connection point of the second electrode of the capacitor element and the anode electrode of the light-emitting element to the power line, and
the controller is configured to correct a threshold voltage of the drive transistor,
wherein the resistance device is a transistor,
wherein the transistor is a second switch element that switches the state between the power line for supplying the initialization voltage and the second electrode of the capacitor element, between the conducting and non-conducting states, and wherein the second switch element has a higher On resistance than any other switch element.

3. A display device, comprising:

a display pixel; and a controller configured to control driving of the display pixel, wherein the display pixel includes a light-emitting element;

a capacitor element that holds a voltage;

a drive transistor that has (i) a gate electrode connected to a first electrode of the capacitor element, and (ii) a source electrode connected to a second electrode of the capacitor element and to an anode electrode of the light-emitting element;

a first switch element that switches a state between a signal line for supplying a voltage corresponding to a data signal and the first electrode of the capacitor element, between conducting and non-conducting states; and a resistance device that has a resistance, is configured to be able to switch a state between a power line for supplying an initialization voltage and the second electrode of the capacitor element between the conducting and non-conducting states, and is disposed on a current path from a connection point of the second electrode of the capacitor element and the anode electrode of the light-emitting element to the power line, and the controller is configured to correct a threshold voltage of the drive transistor, wherein the resistance device is a transistor, wherein the transistor is a second switch element that switches the state between the power line for supplying the initialization voltage and the second electrode of the capacitor element, between the conducting and non-conducting states, and wherein the second switch element has a smaller width-to-length (W/L) ratio than any other switch element.

4. A display device control method for controlling a display device that includes a display pixel and a controller that controls driving of the display pixel, the display pixel including a light-emitting element;

a capacitor element that holds a voltage;

a drive transistor that has (i) a gate electrode connected to a first electrode of the capacitor element, and (ii) a source electrode connected to a second electrode of the capacitor element and to an anode electrode of the light-emitting element;

a first switch element that switches a state between a signal line for supplying a voltage corresponding to a data signal and the first electrode of the capacitor element, between conducting and non-conducting states; and a resistance device that has a resistance, is able to switch a state between a power line for supplying an initialization voltage and the second electrode of the capacitor element between the conducting and non-conducting states, and is disposed on a current path from a connection point of the second electrode of the capacitor element and the anode electrode of the light-emitting element to the power line, the resistance device being a second switch element that switches the state between the power line for supplying the initialization voltage and the second electrode of the capacitor element, between the conducting and non-conducting states, the method comprising:

applying, by the controller a drive voltage to a drain electrode of the drive transistor to drive the light-emitting element, while applying the initialization voltage to the second electrode by applying a reference voltage to the first electrode of the capacitor element and by setting the second switch element in the conducting state; and setting, by the controller, the second switch element in the non-conducting state after the applying of the drive voltage, while maintaining the application of the reference voltage to the first electrode and maintaining the application of the drive voltage to the drain electrode of the drive transistor.

5. The display device control method according to claim 4, wherein the applying of the drive voltage includes:

applying the initialization voltage to the second electrode by applying the reference voltage to the first electrode of the capacitor element and by setting the second switch element in the conducting state, while the application of the drive voltage to the drain electrode of the drive transistor is stopped; and starting the application of the drive voltage to the drain electrode of the drive transistor after the applying of the initialization voltage, while maintaining the application of the reference voltage to the first electrode and maintaining the second switch element in the conducting state.

6. The display device control method according to claim 5, wherein, in the starting of the application of the drive voltage, the controller performs control to cause a voltage applied to a gate electrode of the second switch element to be lower than a voltage applied to a gate electrode of any other switch element.

7. The display device control method according to claim 5, wherein the second switch element is a transistor, and the controller performs control to cause a voltage applied to a gate electrode of the second switch element in the starting of the application of the drive voltage to be lower than a voltage applied to the gate electrode of the second switch element in the applying of the initialization voltage.

* * * * *